United States Patent [19]

Baba

[11] 4,312,044

[45] Jan. 19, 1982

[54] TUNING APPARATUS

[75] Inventor: Michiru Baba, Hamamatsu, Japan

[73] Assignee: Nippon Gakki Seizo Kabushiki Kaisha, Shizuoka, Japan

[21] Appl. No.: 9,950

[22] Filed: Feb. 6, 1979

[30] Foreign Application Priority Data

Feb. 17, 1978 [JP] Japan .................................. 53-17324
Feb. 17, 1978 [JP] Japan ............................ 53-19267[U]
Feb. 17, 1978 [JP] Japan ............................ 53-19268[U]

[51] Int. Cl.[3] ........................ G01R 23/00; G10G 7/02

[52] U.S. Cl. ...................................... 364/554; 84/454; 84/DIG. 18; 235/92 FQ; 328/141; 364/484

[58] Field of Search ....................... 364/554, 484, 575; 235/92 FQ; 84/DIG. 18, 454, 458, 200; 328/133, 141

[56] References Cited

U.S. PATENT DOCUMENTS 2,679,639 5/1954 Locher ............................... 364/575
3,146,344 8/1964 Palmer ............................... 364/554
3,712,536 1/1973 Griffiths ............................... 364/554
4,044,239 8/1977 Shimauchi et al. ........... 84/DIG. 18
4,073,432 2/1978 Schröder ........................ 235/92 FQ
4,144,578 3/1979 Mueller et al. ....................... 364/575
4,196,652 4/1980 Raskin .................................. 84/454

*Primary Examiner*—Errol A. Krass
*Attorney, Agent, or Firm*—Koda and Androlia

[57] ABSTRACT

Tuning apparatus wherein the instantaneous deviations of a measured sound frequency from a reference sound frequency are averaged to display a mean deviation, thereby to improve the stability of the display. As a display unit, preferably a multidigit segment type display unit is used. The deviation data of the sound is visibly indicated as a positional shift of display elements in the display unit. The tuning apparatus can contain a timepiece therein. A reference frequency oscillating source and the display unit are used as constituents common to the tuning apparatus and the timepiece, whereby a timepiece-containing tuning apparatus which is small in size and light in weight is realized.

2 Claims, 37 Drawing Figures

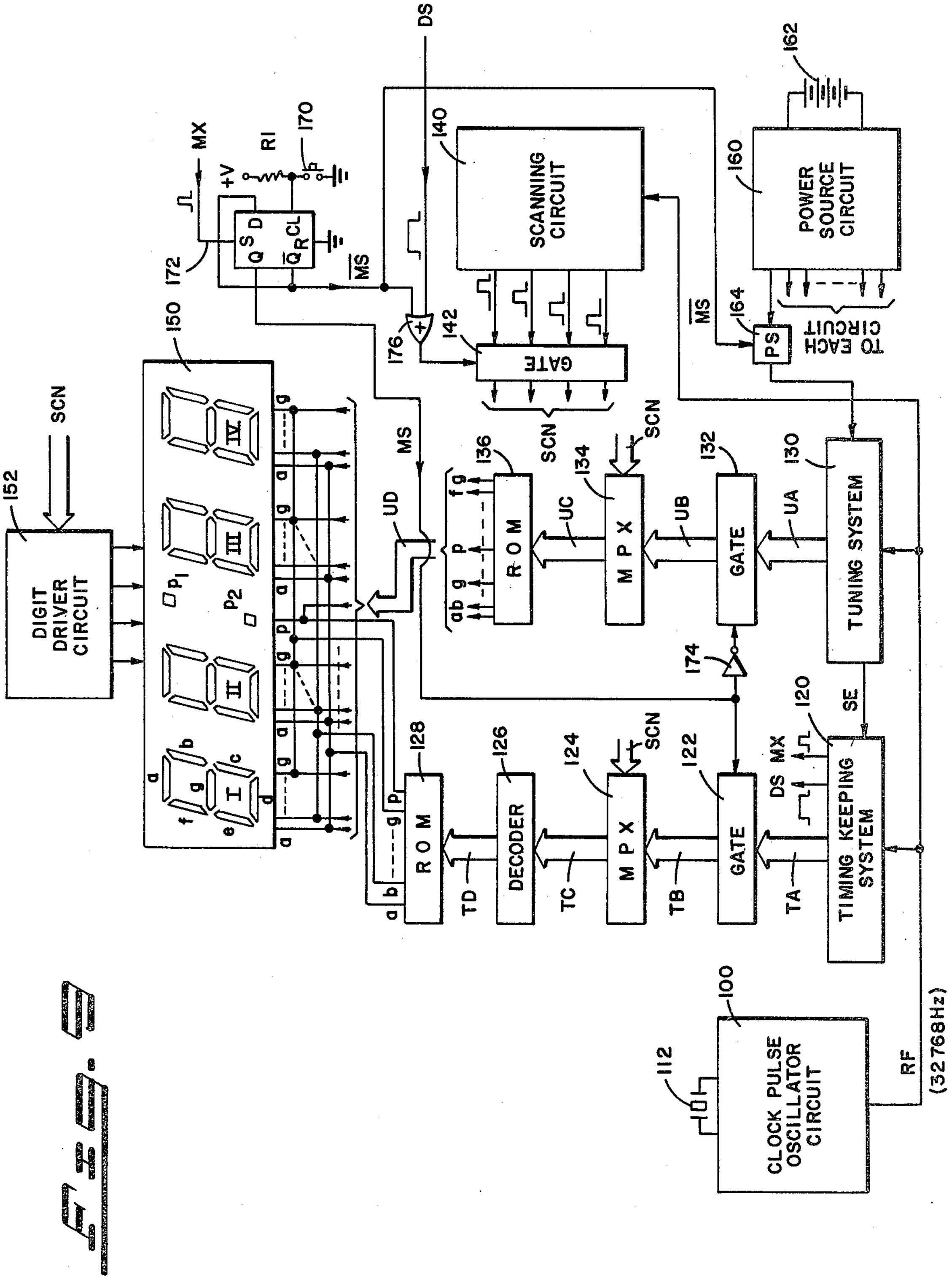
DS
MX
R1
170
+V
172
MS
140
SCANNING CIRCUIT
162
160
POWER SOURCE CIRCUIT
164
PS
TO EACH CIRCUIT
176
142
GATE
150
SCN
152
DIGIT DRIVER CIRCUIT
MS
UD
136
ROM
134
MPX
132
GATE
130
TUNING SYSTEM
UC
UB
UA
174
120
SE
TIMING KEEPING SYSTEM
128
ROM
126
DECODER
124
MPX
122
GATE
TD
TC
TB
TA
100
CLOCK PULSE OSCILLATOR CIRCUIT
112
RF
(32768Hz)

130A
MC
TS
300
302
FUNDAMENTAL WAVE SAMPLING CIRCUIT
S30
304
306
DF1
DF2
DF3
DF4
D
CL
Q
S31
OG
S32
RF (32768Hz)
308
DF5
DF6
S5
S6
NG1
NG2
S7
S8
310
COUNTER
CL
R
Q1
Q2
Q3
Q4
Q5
Q6
Q7
Q8
Q9
Q10
Q11
Q12
NG3
312
LATCH
D1
D2
D3
D4
D5
D6
D7
D8
D9
D10
LT
TO 130B (FIG. 12)
AG1
AG2
AG3
S33
S34
S35
RECTIFIER CIRCUIT
RCF
AMPLITUDE DISCRIMINATOR CIRCUIT
DIFFERENTIATOR CIRCUIT
BLK
SE
314
316
318

TUNING APPARATUS

BACKGROUND OF THE INVENTION

1. Field of the Invention

This invention relates to a tuning apparatus which is suitable for the tuning of a musical instrument, such as a guitar, producing musical sounds prone to frequency fluctuations. More particularly, it relates to a tuning apparatus in which the instantaneous deviations of a measured sound frequency from a reference sound frequency are averaged to display a mean deviation, whereby the oscillations of the displayed information attendant upon the frequency fluctuations of the measured sound are effectively prevented.

2. Prior Art

The tuning apparatus hitherto proposed is such that the fundamental wave of a measured sound is sampled, and that the instantaneous deviations of the fundamental wave frequency from a reference sound frequency are detected and indicated on a pointer type display unit in succession. In general, in case of tuning a string of a guitar, etc., the measured string resonates with another unmeasured string. Due to slight shifts from the n-th harmonic relations (n=1, 2 . . . ) between the measured and unmeasured strings, the sound of the measured string is heard as if its frequency were fluctuating. The prior art tuning apparatus is so constructed and operated that the instantaneous deviation of the fundamental wave frequency from the reference sound frequency is indicated on the display unit every certain time interval. Therefore, not only in the case where the measured sound itself is attended with the frequency fluctuation effect as stated above, but also in a case where it is constant in frequency, it is often the actual condition that the instantaneous deviation fluctuates rapidly under the influence of ambient noise, the display being unstable and oscillating. In particular, in cases where the display is made with the pointer type display unit, the movement of the pointer does not reliably follow up the fluctuations of the instantaneous deviation and accompanies excess and deficiency, so that the instability of the display is conspicuous. Such an instability of the display must be compensated for in practice in such a way that an observer reads the center of the oscillations. With the reading of the center of the oscillations of the display value by the observer, however, a considerable dispersion inevitably develops in read values in dependence on the time of the reading and the experience or perception of the observer. Especially in the case of the pointer type display unit, it is difficult to read the display value reliably, which has been an obstacle to a precise and prompt tuning.

SUMMARY OF THE INVENTION

An object of this invention is to provide a novel tuning apparatus which can relieve the oscillations of a display value and in which the variations of the display value can be reliably read.

A feature of the tuning apparatus according to this invention is that, while attaching comparative importance to the newest data on a few instantaneous deviations, they are averaged and displayed.

Another object of this invention is to provide a novel tuning display device which displays the deviations (amounts of shift) of a measured sound from a reference sound in a plurality of stages and from which the display can be easily and promptly read.

A feature of the tuning display device according to this invention is that the deviation information of sounds are indicated as the potential shifts of display elements.

Still another object of this invention is to provide a tuning apparatus which is small in size and light in weight and has a high precision and which premises that a musician uses it while always putting it on, and which can function as a timepiece when the primary tuning function is not used.

A feature of the timepiece-containing tuning apparatus according to this invention is that both an oscillation source such as crystal oscillator and a display unit such as a multidigit segment-type display unit are used in common for the tuning and the timepiece.

BRIEF DESCRIPTION OF THE DRAWINGS

These and other objects, features and advantages of the present invention will be made more apparent from the following explanation of preferred embodiments thereof taken in conjunction with the accompanying drawings in which:

FIG. 3 is a circuit diagram which shows a decoder circuit for a display unit in the apparatus of FIG. 1.

FIGS. 8(A)–8(M) are time charts for explaining the operations of the circuit in FIG. 7.

FIG. 9 is a block diagram of timepiece-containing tuning apparatus according to still another embodiment of this invention.

DETAILED DESCRIPTION OF THE EMBODIMENTS

Figure 1:
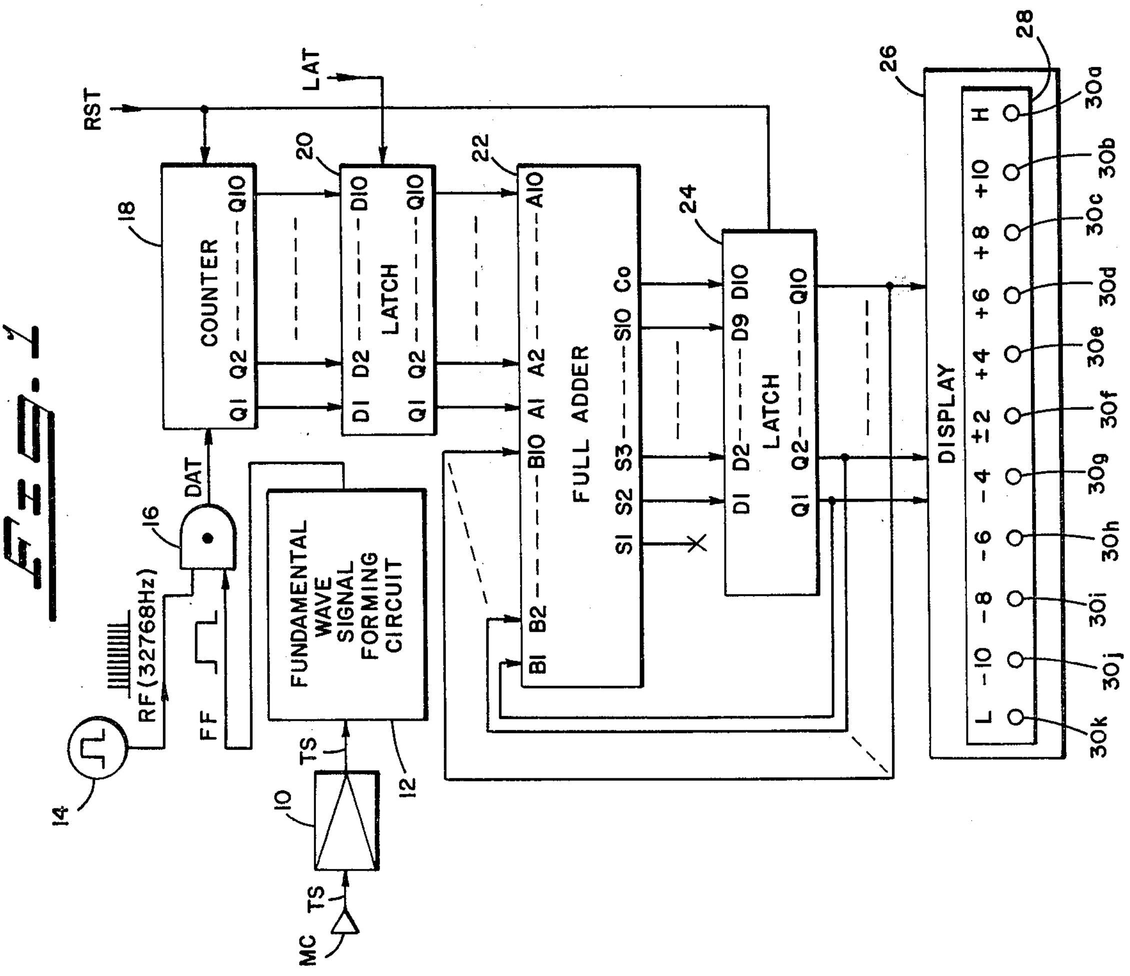
FIG. 1 is a block diagram which shows a circuit arrangement of a tuning apparatus according to an embodiment of this invention.
Figure 2:
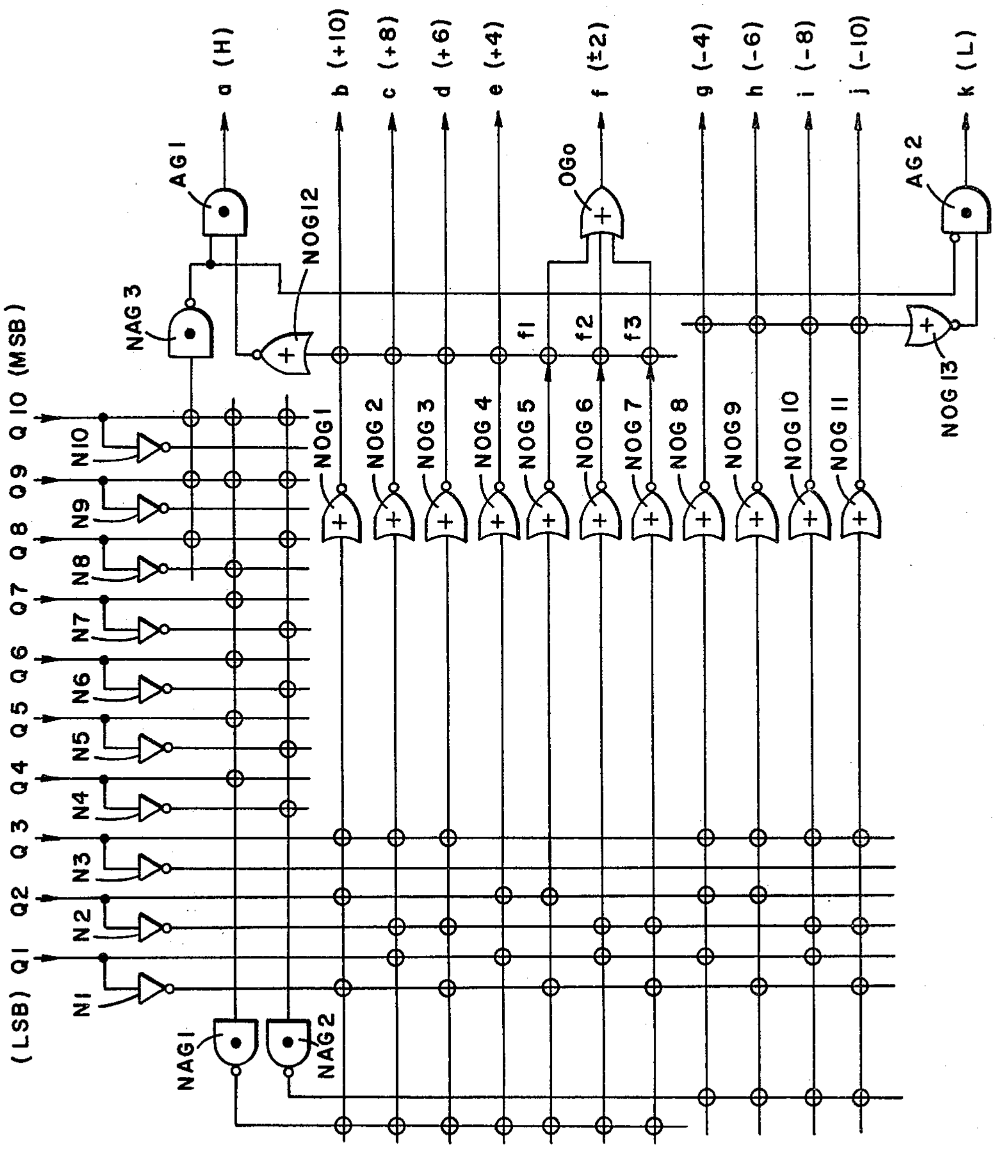

FIG. 1 shows the circuit arrangement of a tuning apparatus according to an embodiment of this invention. The tuning apparatus of this embodiment has been designed so as to be used mainly for the tuning of a guitar. It can decide how large is the deviation of the frequency of the sound of the fifth string in the open state with respect to the frequency 110 Hz of a reference sound often used in the tuning of the guitar. The tuning of the other strings can be readily achieved by pressing down frets or utilizing harmonics with reference to the result of the tuning of the fifth string.

Here, the principle of the apparatus in FIG. 1 will be briefly explained. The actual tuning may be carried out by way of example by counting how many clock pulses at a fixed frequency of 32,768 Hz fall within one recurrent period of the reference sound frequency of 110 Hz and by displaying a deviation from this count value as the reference (0 cent). According to calculation, 297.89 clock pulses of 32,768 Hz fall within one period of the frequency 110 Hz. It is now supposed that the precision of discrimination is made 2 cents. Then it is convenient that three cyclic periods of an input signal corresponding to the fundamental wave of a sound to-be-measured are made one sample to count how many clock pulses fall therein so that the deviation of the counted value relative to a reference value is evaluated. Table 1 indicates the relationship among various deviations which are required in case of finding deviation data with the tuning apparatus of this embodiment, input frequencies which correspond to the various deviations, and those numbers of clock pulses within one sample which correspond to the various input frequencies. The "count value" in the table signifies a value which a counter counts in the case where the discrimination is done at a precision of 2 cents.

TABLE 1

| Deviation (in cent) | Input Frequency (in Hz) | Number of Clock Pulses | Count Value |
|---|---|---|---|
| +10 | 110.6372 | 888.5 | 889 |
| +9 | 110.5733 | 889.0 | |
| +8 | 110.5095 | 889.6 | 890 |
| +7 | 110.4456 | 890.1 | |
| +6 | 110.3819 | 890.6 | 891 |
| +5 | 110.3182 | 891.1 | |
| +4 | 110.2545 | 891.6 | 892 |
| +3 | 110.1903 | 892.1 | |
| +2 | 110.1271 | 892.6 | 893 |
| +1 | 110.0636 | 893.2 | |
| 0 | 110.0000 | 893.7 | 894 |
| −1 | 109.9365 | 894.2 | 894 |
| −2 | 109.8730 | 894.7 | |
| −3 | 109.8095 | 895.2 | 895 |
| −4 | 109.7462 | 895.7 | |
| −5 | 109.6828 | 896.3 | 896 |
| −6 | 109.6194 | 896.8 | |
| −7 | 109.5561 | 897.3 | 897 |
| −8 | 109.4129 | 897.8 | |
| −9 | 109.4296 | 898.3 | 898 |
| −10 | 109.3664 | 898.9 | |

The tuning apparatus of FIG. 1 consists fundamentally in that a counter 18 is disposed which counts clock pulses of 32,768 Hz so as to become the count values given in Table 1, that instantaneous deviation data made up of count outputs of the counter 18 are averaged by circuits 20, 22 and 24 which are disposed at stages preceding to a display unit 26, and the average deviation data thus obtained is visibly displayed on the display unit 26.

Now, the apparatus of FIG. 1 will be concretely described. MC designates an acousto-electric transducer such as microphone which picks up a sound to-be-measured to convert it into an electrical tone signal TS. The tone signal TS from the acousto-electric transducer MS is entered through an amplifier 10 into a fundamental wave signal forming circuit 12. The fundamental wave signal forming circuit 12 derives a fundamental wave from the tone signal TS, and generates a fundamental wave signal FF of a pulse width which corresponds to a time interval of three cyclic periods (i.e., one same) of the fundamental wave. The fundamental wave signal FF is supplied to one input terminal of a 2-input AND gate 16. As a fundamental wave deriving or sampling means in the fundamental wave signal forming circuit 12, various means known in themselves can be used. By way of example, the use of a fundamental wave sampling circuit disclosed in my co-pending application, Ser. No. 915,758 filed on June 15, 1978 and comprising a peak hold circuit and a comparator in combination is favorable in points of exactitude and stability. More specifically, in the fundamental wave sampling circuit, the peak hold circuit detects a peak amplitude value of the tone signal input, while the comparator compares instantaneous amplitude values of the tone signal input with the detected peak amplitude value and produces a coincidence pulse at each coincidence. Thus, a fundamental wave containing pulse signals which consists of a train of successive coincidence pulses is formed. By subjecting the fundamental wave containing pulse signal to an appropriate operation of pulse sampling or pulse width discriminating, a fundamental wave pulse signal of a period corresponding to the period of the fundamental wave of the tone signal input can be obtained simply and reliably. Such a fundamental wave sampling circuit is not affected by amplitude fluctuations of the input or noise, and provides accurate digital information on the period of the input fundamental wave. Therefore, it is very effective when adopted in the performance of this invention. The fundamental wave signal FF is formed by dividing by 3 the frequency of the train of fundamental wave pulses obtained as stated above.

A clock pulse source 14 generates a clock pulse signal RF at a fixed frequency of 32,768 Hz. The clock pulse signal RF is supplied to the other input terminal of the AND gate 16. The AND gate 16 allows the clock pulses RF to pass during a time interval corresponding to the pulse width of the fundamental wave signal FF, thereby to deliver to the counter 18 sample data DAT which include groups of sample pulses A, B, C . . . each consisting of a train of passed pulses as illustrated in FIG. 2(A).

The counter 18 counts the clock pulses which are included in each of the sample pulse groups A, B, C . . . of the sample data DAT. This counter repeats the counting operation each time it is reset by a reset signal RST supplied to its reset input terminal R as shown in FIG. 2(C). The counter 18 is constructed of a 10-bit counter so that it can count the clock pulses until the count values as given in Table 1 are reached. Count outputs obtained from output terminals Q1–Q10 of the counter 18 constitute instantaneous deviation data of a 10-bit binary signal which represents the instantaneous deviation of the frequency of the measured sound from the reference frequency. Table 2 gives by way of example several count values in the counter 18 and binary information corresponding to the respective count values. The count value 894 corresponds to the deviation of 0 cent.

TABLE 2

| Count Value | Binary (MSB) Number (LSB) |
|---|---|
| 889 | 1101111001 |
| 890 | 1101111010 |
| 891 | 1101111011 |
| 892 | 1101111100 |
| 893 | 1101111101 |
| 894 | 1101111110 |
| 895 | 1101111111 |
| 896 | 1110000000 |
| 897 | 1110000001 |
| 898 | 1110000010 |
| 899 | 1110000011 |

The count outputs, i.e. instantaneous deviation data, which are made up of the binary signal as exemplified in Table 2 are supplied to input terminals D1–D10 of the first latch circuit 20. The latch circuit 20 latches the count outputs from the counter 18 in response to a latch signal LAT supplied to its latch input terminal LT, as shown in FIG. 2(B), each time the operation of counting the pulses for one sample in the counter 18 terminates. The latched contents are as illustrated in FIG. 2(D).

Figure 2:
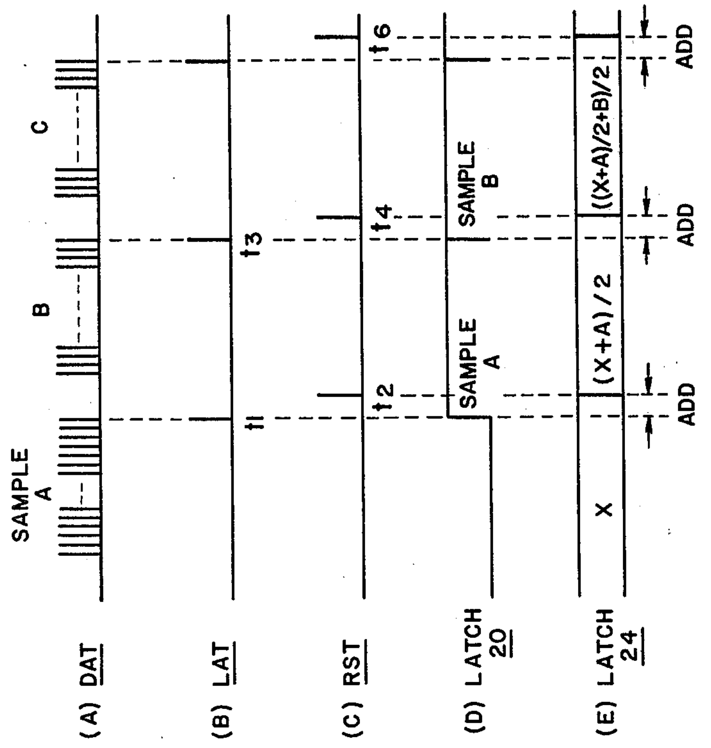
FIGS. 2(A)–2(E) are time charts for explaining the operations of the circuit in FIG. 1.

The full adder 22 receives latch outputs from output terminals Q1–Q10 of the first latch circuit 20 at input terminals A1–A10 on one side thereof, and also receives latch outputs from output terminals Q1–Q10 of the second latch circuit 24 at input terminals B1–B10 on the other side thereof. Thus, it adds both the latch outputs. Among output signals from output terminals S1–S10 and Co (carry out) of the full adder 22, only those from the terminals S2–S10 and Co are supplied to input terminals D1–D10 of the second latch circuit 24, whereby the added outputs from the full adder 22 are entered into the latch circuit 24 in a halved form. The latch circuit 24 executes a latch operation in response to the foregoing reset signal RST supplied to its latch input terminal LT. As shown in FIG. 2(E), its latch contents are the sample data as averaged. In FIG. 2, "ADD" indicates a period of addition.

The display unit 26 visually indicates the averaged instantaneous deviation on a panel face 28 in conformity with the latch outputs, namely the mean deviation data, from the second latch circuit 24. In the panel face 28, dot-shaped display elements (for example, light emitting elements such as light emitting diodes) totaling eleven 30*a* through 30K are arranged into one row in a manner to correspond to eleven cent-deviation-signals "H", "+10", "+8", "+6", "+4", "+2", "−4", "−6", "−8", "−10" and "L" respectively. The display unit 26 includes a decoder circuit which decodes the mean deviation data from the second latch circuit 24, and a driver circuit which drives the light emitting elements 30*a*–30*k* in response to decode outputs from the decoder circuit.

Table 3 indicates the relationship between inputs and outputs of the decoder circuit and display values on the panel face in the display unit 26.

TABLE 3

| Input (Mean deviation) | Output | Display Value |
|---|---|---|
| 889 | a | H |
| 889 | b | +10 |
| 890 | c | +8 |
| 891 | d | +6 |
| 892 | e | +4 |
| 893, 894, 895 | f | ±2 |
| 896 | g | −4 |
| 897 | h | −6 |
| 898 | i | −8 |
| 899 | j | −10 |
| 899 | k | L |

Although in Table 3 the decoder inputs (mean deviation) are expressed by decimal numbers, they are actually the same binary signals as previously given in Table 2. The outputs a–k are applied to driver stages corresponding to the light emitting elements 30*a*–30*k*, respectively. As indicated in Table 3 mentioned above, for the case where the mean deviation data is smaller than 889, the display of "H" appears on the panel face 28, and it signifies that the measured sound shifts more than 10 cents onto the higher pitch side relative to the reference frequency (0 cent, 110 Hz). When the mean deviation data is 893, 894 or 895, merely the display of "±2" appears on the panel face 28, and it signifies that the measured sound has only the deviation within 2 cents on the higher pitch or lower pitch side relative to the reference frequency and that the measured string is in a substantially tuned state. Further, for the case where the mean deviation data is greater than 899, the display of "L" appears on the panel face 28, and it signifies that the measured sound shifts more than 10 cents onto the lower pitch side relative to the reference frequency. For cases other than those exemplified above, "+" and "−" signify the presence of cent deviations corresponding to display values on the higher pitch side and on the lower pitch side respectively. According to Table 3, the deviations 893–895 are indicated as ±2 cents and the deviations 896, 897, 898 and 899 are respectively indicated as −4, −6, −8 and −10 cents, and the indications are not exactly the same as the corresponding relations given in Table 1. However, discrepancies in the display to such an extent are quite negligible in practice.

The decoder circuit which has the decode function as given in Table 3 is constructed by way of example as shown in FIG. 3. Referring to FIG. 3, N1–N10 designate inverters which invert the latch outputs (mean deviation data) Q1 (LSB)–Q10 (MSB) respectively. NAG1–NAG3 designate NAND gates each of which provides an output "1" if even one of respective inputs is "0" and provides an output "0" if all the respective inputs are "1". NOG 1–NOG13 designate NOR gates each of which provides an output "1" if all of respective inputs are "0" and provides an output of "0" if even one of the respective inputs is "1". Marks or circles on the circuit line crossings designate input connections of the various gates.

The NAND gate NAG 1 serves to generate the output "0" by detecting that the upper-digit 7 bits (Q10–Q4) of the latch outputs from the latch circuit 24 previously described become "1101111". The NOR gate NOG1 generates the output b="1" and makes the display of the deviation data of +10 cents possible when the lower-digit 3 bits (Q3–Q1) of the latch outputs are "001" and besides the output of the NAND gate NAG 1 is "0" (that is, when the mean deviation data is 889 in the decimal notation). Likewise, for the case where the output of the NAND gate NAG1 is "0", when the lower-digit 3 bits of the latch outputs are "010", "011", "100", "101", "110" and "111" respectively (that is, when the mean deviation data are 890, 891, 892, 893, 894 and 895 in the decimal notation respectively), respective outputs c, d, e, f1, f2, and f3 of the NOR gates NOG2, NOG3, NOG4, NOG5, NOG6 and NOG7 become "1". Therefore, it becomes possible to indicate the deviation data of +8, +6 and +4 in response to the outputs c, d and e respectively. On the other hand, an output f of an OR gate 0G0 which receives f1–f3 as its inputs becomes "1", so that the display of the deviation data of ±2 cents becomes possible.

The NAND gate NAG2 serves to generate the output "0" by detecting that the upper-digit 7 bits (Q10–Q4) of the latch outputs become "1110000". In case where the NAND gate NAG2 provides "O" as its output, when the lower-digit 3 bits (Q3–Q1) of the latch outputs are "000", "001", "010" and "011" respectively (that is, when the mean deviation data are 896, 897, 898 and 899 in the decimal notation respectively), respective outputs g, h, i and j of the NOR gates NOG8, NOG9, NOG10 and NOG11 become "1". It is accordingly possible to indicate the deviation data of −4, −6, −8 and −10 in response to the outputs g, h, i and j respectively.

The NAND gate NAG 3 receives the signals of the upper-digit 3 bits of the latch outputs, and provides the output "1" if even one of the received signals is "0". Here, the fact that at least one of the received signals is "0" signifies that the latch outputs are equal to or smaller than 895 in the decimal notation. Therefore, if the output of the NAND gate NAG3 is "1", it is decided that the measured sound shifts substantially on the high-pitched sound side, and if the output is "0", it is decided that the measured sound shifts on the low-pitched sound side. On the other hand, the NOR gate NOG12 receives the aforecited NOR outputs b, c, d, e and f1–f3 as its inputs. It generates an output "1" when all the inputs are "0", and it generates an output "0" in any other case. The AND gate AG1 receives the output of the NAND gate NAG 3 and the output of the NOR gate NOG12 as its inputs, and it provides the outputs a="1" when both the input signals are "1". That is, the output a="1" is generated when "0" is provided in any of the upper 3 digits (Q8, Q9, Q10) (this signifies that the latch outputs are not greater than 895 in the decimal notation) and besides the lower 3 digits are not any of "010", "011", "100", "101", "110" and "111" (the latch outputs are not any of 891, 892, 893, 894 and 895 in the decimal notation, they are "0" outputs). Accordingly, the output a="1" indicates that the measured sound shifts more than 10 cents on the high-pitched sound side, so that the display of the deviation data of "H" becomes possible with the output a.

The NOR gate NOG13 receives the foregoing NOR outputs g, h, i and j as its inputs. It generates an output "1" when all these inputs are "0", and generates an output "0" in any other case. The AND gate AG2 receives the output from the NAND gate NAG13 at an inverting input terminal thereof, and also receives the output of the NOR gate NOG13 at a non-inverting input terminal thereof. When the input signal to the non-inverting input terminal is "0" (when the measured sound is not a higher-pitched sound, that is, it deviates on the low-pitched sound side), the AND gate AG2 generates the output K="1" provided that the input signal to the non-inverting input terminal is "1", in other words all the foregoing NOR outputs g–j are "0" (that the latch outputs are not 896, 897, 898 and 899 in the decimal notation). Accordingly, the output k="1" indicates that the measured sound deviates more than 10 cents on the low-pitched sound side, so that the display of the deviation data of "L" becomes possible with the output k.

The decoded outputs a–k obtained as above described are supplied to an appropriate driver circuit having driver stages corresponding to the respective outputs. The respective driver stages drive the light emitting elements 30*a*–30*k* shown in FIG. 1 in response to the corresponding outputs a–k. Therefore, the light emitting elements 30*a*–30*k* are controlled so that each time the signal of a specified one of the decode outputs a–k becomes "1", only one specified element corresponding thereto may be lit up. Thus, the deviation data display in the aspect as illustrated in Table 3 given before is accomplished.

Referring again to FIGS. 2(A)–(E), the display operation attended with the averaging processing in the circuit of FIG. 1 will be described in detail. Now, let A, B and C denote the pulse count values of the groups of sample pulses A, B and C, respectively. Let it be supposed that, in the initial state, the latch circuit 24 latches a binary signal representative of a certain numerical value X, so the display unit 26 indicates deviation data corresponding to the numerical value X. Under this state, the counter 18 counts the clock pulses of the sample A after starting the operation. At a time t1, the count value A of the counter 18 is latched by the latch circuit 20. At a time t2, the reset signal RST is generated. During the time interval (ADD) of the time t1–the time t2, the full adder 22 adds the numerical value A latched by the latch circuit 20 and the numerical value X latched by the latch circuit 24, multiplies the added value by ½ and transmits the result to the latch circuit 24. The latch circuit 24 latches the transmitted data (X+A)/2 from the full adder in response to the reset signal RST at the time t2. Simultaneously therewith, the counter 18 is reset, and it is ready for the operation of counting the pulses of the next sample B.

During an interval from the time t2 to a time t3, the counter 18 counts the pulses of the sample B, and the count value B is latched in the latch circuit 20 at the time t3. On the other hand, during the interval t2–t3, the latch circuit 24 holds the numerical value (X+A)/2, and hence, the display unit 26 indicates deviation data corresponding to the numerical value. At a time t4, the counter 18 is reset, and the latch circuit 24 conducts the latch operation. During an interval (ADD) of the time t3–the time t4, the full adder 22 conducts the adding operation as in the preceding interval ADD. It adds the numerical value B latched by the latch circuit 20 and the numerical value B latched by the latch circuit 20 and the numerical value (X+A)/2 latched by the latch circuit 24, multiplies the added value by ½, and transmits the result to the latch circuit 24. The latch circuit 24 latches the transmitted data ((X+A)/2+B)/2 at the time t4. Simultaneously therewith, the counter 18 is reset to get itself ready for the operation of counting the pulses of the next sample C. The display content of the display unit 26 changes from (X+A)/2 to ((X+A)/2+B)/2 at the time t4.

The operations as above exemplified are repeated, whereby the averaged instantaneous deviation data are sequentially indicated on the display unit 26. When conjectured from the above operations, it will be understood that the display contents of the display unit 26 at times t4, t6, t8, t10 and t12 are expressed by the following equations:

(1) time $t4$ $$((X + A)/2 + B)/2 \quad (1)$$

(2) time $t6$ $$(((X + A)/2 + B)/2 + C)/2 \quad (2)$$

(3) time $t6$ $$((((X + A)/2 + B)/2 + C)/2 + D)/2 \quad (3)$$

(4) time $t8$ $$(((((X + A)/2 + B)/2 + C)/2 + D)/2 + E)/2 \quad (4)$$

(5) time $t10$ $$((((((X + A)/2 + B)/2 + C)/2 + D)/2 + E)/w + F)/2 \quad (5)$$

(6) time $t12$ $$(((((((X + A)/2 + B)/2 + C)/2 + D)/2 + E)/2 + F)/2 + G)/2 \quad (6)$$

Figure 4:
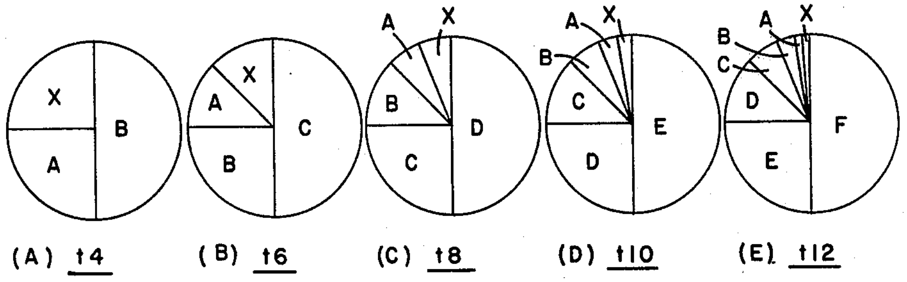
FIGS. 4(A)–4(E) are circular graphs which show time variations of display contents in the display unit.

FIG. 4 shows by circular graphs the changes of the display contents expressed by the above equations (1)–(6). It is understood from the equations and FIG. 4 that, as the result of the averaging processing, the influence of the initial value X decreases gradually with the lapse of time, and that by way of example when the data of the sixth sample enter (at t12), the initial value X becomes about 1.5% of the display value and is hardly influential.

How the display of the tuning apparatus according to this invention adopting the averaging processing as above stated differs from the display of prior-art apparatus without such an averaging processing will now be described by mentioning several examples. First, in such a case where samples A–J fluctuate greatly up and down about 0 cent with the lapse of time t, display values in the prior art and this invention are compared and indicated as in Table 4 below.

TABLE 4

| Sample | A | B | C | D | E | F | G | H | I | J |
|---|---|---|---|---|---|---|---|---|---|---|
| Display value in prior art | −6 | +8 | −4 | +6 | −2 | −4 | +4 | −2 | +10 | 0 |
| Mean Value | −6 | +1 | −1.5 | +2.3 | +0.6 | −1.7 | +1.2 | −0.4 | +4.8 | +2.4 |
| Display value according to this invention | −6 | ±2 | ±2 | +4 | ±2 | ±2 | ±2 | ±2 | +6 | +4 |

Figure 5:
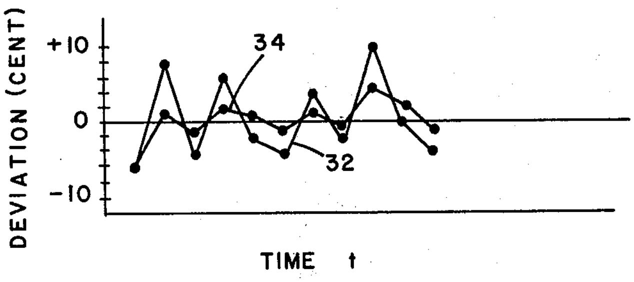
FIGS. 5 and 6 are graphs both of which show time variations of display values by comparisons in relation to prior art and embodiments of this invention.

The time changes of the display values in Table 4 are illustrated in FIG. 5. In FIG. 5, curve 32 indicates the change in the prior art, while curve 34 indicates the changes in this invention. It is apparent from Table 4, and FIG. 5 that, in the tuning apparatus of this invention adopting the averaging processing, the display values gather in the vicinity of 0 cent being the center of fluctuations. Accordingly, the tuning apparatus of this invention can be exempted from the frequent changes of the display values, resulting in the advantage that the reading of the display value becomes very easy.

Regarding a case where, as for example the tuning of the guitar, the display values change greatly in plus and minus signs by tightening or loosening a string. Changes of the samples A–J versus time t and the attendant changes of the display values or mean values as in the foregoing examples are indicated as in Table 5 below.

TABLE 5

| Sample | A | B | C | D | E | F | G | H | I | J |
|---|---|---|---|---|---|---|---|---|---|---|
| Display value in prior art | −10 | −6 | −8 | −4 | 0 | −2 | +4 | +8 | +6 | +10 |
| Mean value | −10 | −8 | −8 | −6 | −3 | −2.5 | +0.8 | +4.4 | +5.2 | 7.6 |
| Display value according to this invention | −10 | −8 | −8 | −6 | −4 | −4 | +2 | +6 | +6 | +8 |

Figure 6:
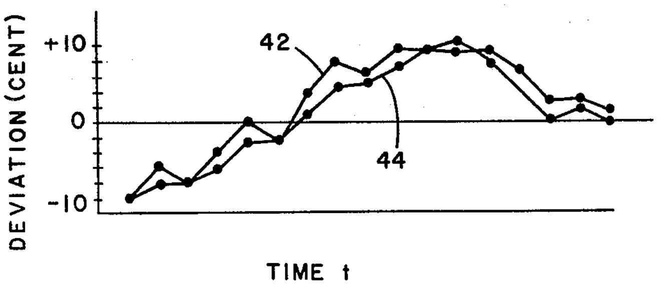

The time changes of the display values in Table 5 are illustrated in FIG. 6. In FIG. 6, curve 42 indicates the changes in the prior art, while curve 44 indicates the changes in this invention. It is apparent from Table 5 and FIG. 6 that, in the tuning apparatus of this invention adopting the averaging processing, the changes of the display values following up the changes of the instantaneous deviations are relatively slow to facilitate the visual observation.

In the embodiment described above, while placing comparative importance on the newest data the deviation data are averaged, and the averaged deviation data is indicated without any wait time (although the sampling time is involved, it is comparatively short), i.e., in real time. Therefore, in case where the string is frequently loosened or tightened especially as in the tuning of the guitar (tuning of the string), a good display following-up is attained, and great practical effects are attendant upon the decrease of the fluctuations of the display. Another advantage is that the number of hardware components such as adder, memory, multiplier circuit and counter may be smaller than in apparatus to be stated later which is based on the simple averaging. In addition to the effect of display stabilization attendant upon the averaging processing, the foregoing tuning apparatus has the effect that the display values can be read easily and reliably, or so to speak, intuitively because the mean deviation is indicated by the dot-shaped display devices which are arranged in a manner to successively shift on both the sides of the central position (0 cent position).

In performing this invention, it is possible to use an averaging method other than the foregoing one, for example, the method of taking the simple averages (that is, (A+B)/2, (A+B+C)/3, (A+B+C+D)/4, etc.). With this method, functional effects similar to those in the foregoing case can be attained. Now, the tuning apparatus according to another embodiment which adopts the simple averaging method as indicated by the example (A+B+C+D)/4 will be described with reference to FIGS. 7 and 8.

Figure 7:
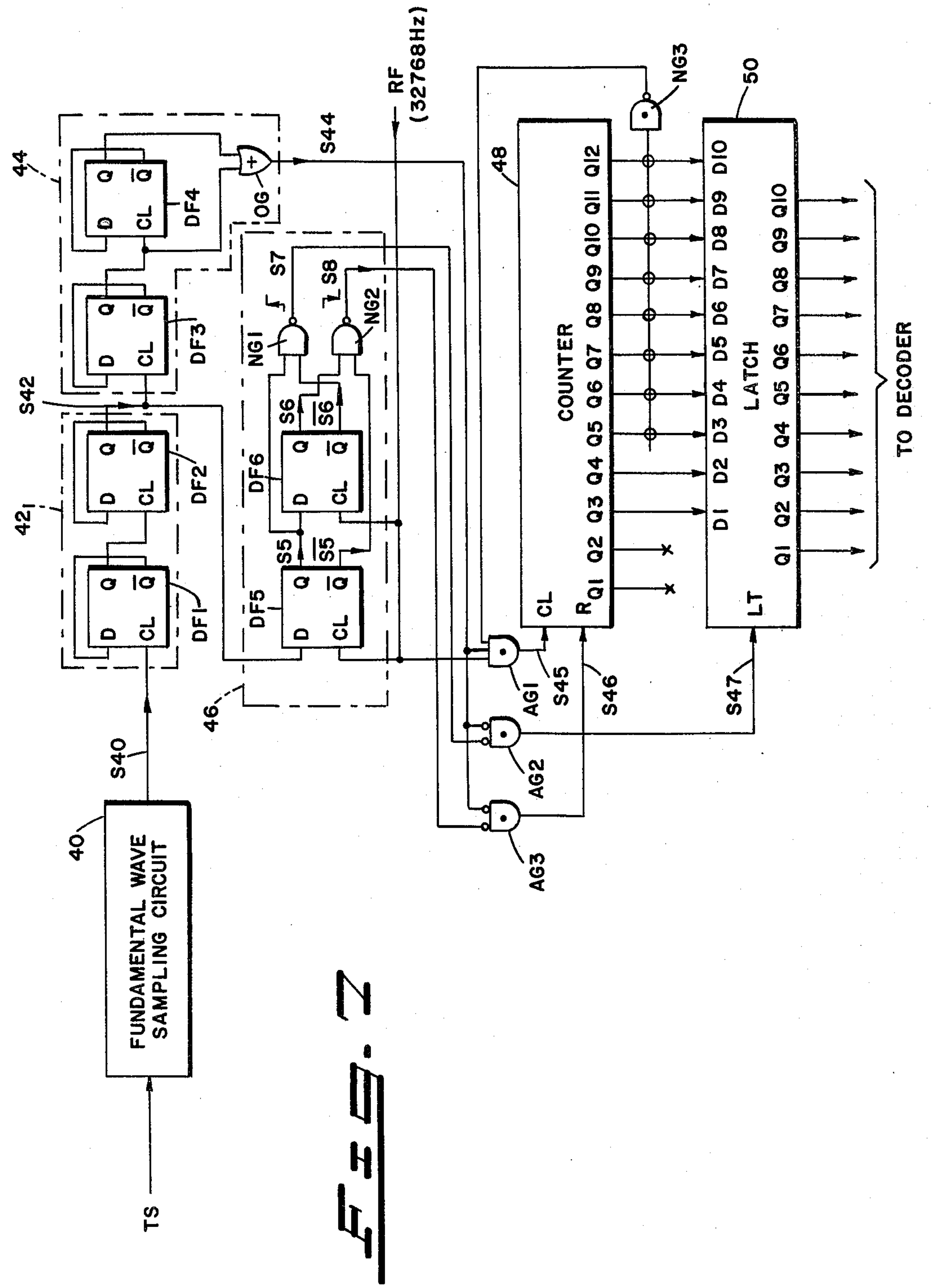
FIG. 7 is a circuit diagram which shows a mean deviation data-forming circuit in tuning apparatus according to another embodiment of this invention.
Figure 4:
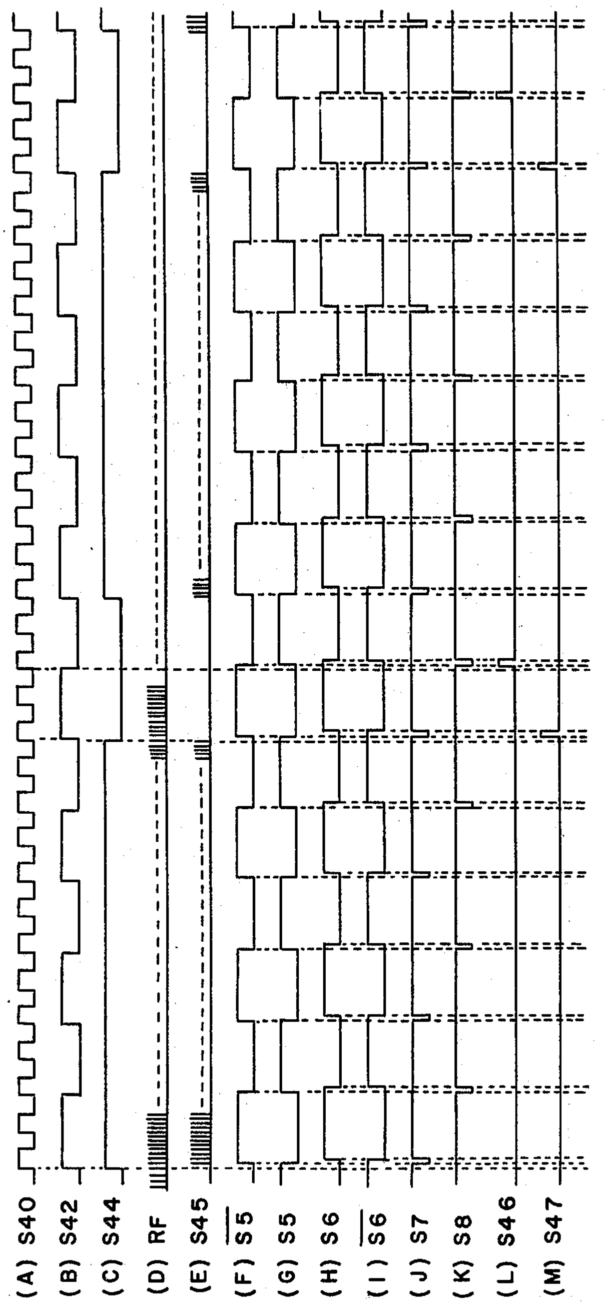

FIG. 7 shows a mean deviation data forming circuit in the tuning apparatus. Numeral 40 designates a fundamental wave sampling circuit, numeral 42 a $\frac{1}{4}$ frequency demultiplier circuit, numeral 44 a gate signal forming circuit, numeral 46 a synchronizing differentiator circuit, numeral 48 a counter for forming a total deviation, and numeral 50 a mean deviation data latch circuit. The fundamental wave sampling circuit 40 may be of a construction similar to that explained on the embodiment of FIG. 1 before. A tone signal TS is supplied from an acousto-electric transducer through an amplifier to an input terminal of the fundamental wave sampling circuit 40 as stated previously. From an output terminal of the fundamental wave sampling circuit 40, there is provided a fundamental wave pulse signal S40 as shown in FIG. 8(A) that consists of a train of pulses arising at a timing corresponding to the period of the fundamental wave of the input tone signal TS. The fundamental wave pulse signal S40 is supplied to the ¼ frequency demultiplier circuit 42 and is subjected to ¼ frequency division. The circuit 42 has an arrangement in which two D (dealy) flip-flops DF1 and DF2 are connected in cascade. As a result, a ¼ frequency division output S42 as shown in FIG. 8(B) is generated from an output terminal of the ¼ frequency demultiplier circuit 42.

The ¼ frequency division output S42 is supplied to the gate signal forming circuit 44 on one side, and to the synchronizing differentiator circuit 46 on the other side. The gate signal forming circuit 44 comprises two D flip-flops DF3 and DF4 which are connected in cascade, and a 2-input OR gate OG which receives as its inputs an output Q of the flip-flop DF3 (a signal with the output S42 subjected to ½ frequency division) and an output Q of the flip-flop DF4 (a signal with the output S42 subjected to ¼ frequency division). Provided from an output terminal of the OR gate OG is a gate signal S44 which, as shown in FIG. 8(C), assumes level "1" during an interval corresponding to 12 periods of the fundamental wave pulse signal S40 and assumes level "0" during an interval corresponding to 3 periods of the signal S40. The gate signal S44 is supplied to the synchronizing differentiator circuit 46 while it is supplied to an AND gate AG1 in order to have an AND taken with clock pulses RF as shown in FIG. 8(D). As the clock pulses RF, there is used the fixed frequency clock signal of 32,768 Hz which is generated from the clock pulse source as shown in FIG. 1 before. As illustrated in FIG. 8(E), an AND output S45 from the AND gate AG1 consists of clock pulses which have passed through the AND gate AG1 during the interval during which the gate signal S44 is "1".

In the synchronizing differentiator circuit 46, two D flip-flops DF5 and DF6 and two NAND gates NG1 and NG2 are disposed. As an input D of the flip-flop DF5, the output Q of the flip-flop DF2, (the ¼ frequency division signal S42) is supplied, and as an input of the flip-flop DF6, an output Q of the flip-flop DF5 is supplied. As clock inputs CL of the respective flip-flops DF5 and DF6, there are supplied the same fixed-frequency clock pulses RF of 32,768 Hz as those supplied to the AND gate AG1. Therefore, the flip-flops DF5 and DF6 receive the respective inputs D in synchronism with the positive-going of the clock pulses RF. As the output Q of the flip-flop DF5, there is obtained a ¼ frequency division signal S5 as shown in FIG. 8(F) that is synchronized with the clock pulses RF. As an output Q of the flip-flop DF6, there is obtained a signal S6 as shown in FIG. 8(H) that is produced by delaying such a synchronized ¼ frequency division signal S5 by one period of the clock pulse RF. The NAND gate NG1 takes the NAND between an inverted signal S6 as shown in FIG. 8(I) with the delayed signal S6 inverted and the synchronized ¼ frequency division signal S5 (FIG. 8(F)), and it generates a negative-going pulse signal S7 as shown in FIG. 8(J) that is synchronous with the rise of the ¼ frequency division signal S42. The negative-going pulse S7 has its AND taken with "0" of the gate signal S44 by an AND gate AG2, and a latch signal S47 as shown in FIG. 8(M) is provided from an output terminal of the AND gate AG2. On the other hand, the NAND gate NG2 takes the NAND between the delayed signal S6 (FIG. 8(H)) being the output Q of the flip-flop DF6, and a synchronized ¼ frequency division signal S5 shown in FIG. 8(G) and being an output Q of the flip-flop DF5. It provides a negative-going pulse signal S8 as shown in FIG. 8(K) that is synchronous with the fall of the signal S42. The negative-going pulse signal S8 has its AND taken with "0" of the gate signal S44 by an AND gate AG3, and a reset signal S46 as shown in FIG. 8(L) is provided from an output terminal of the AND gate AG3.

The counter 48 serves to form the total deviation data by counting the clock pulses S45 as shown in FIG. 8(E) that are supplied from the AND gate AG1 to a clock input terminal CL thereof. The count operation is repeated each time the counter 48 is reset by the reset signal S46 (FIG. 8(L)) supplied to a reset input terminal R thereof. Since the counter 48 counts the clock pulses RF during the interval equal to 12 periods (which correspond to 4 samples when 1 sample is assumed to consist of 3 periods as in the foregoing embodiment) of the input fundamental wave as illustrated in FIG. 8(E), its count value is four times as great as the count value of the counter shown in FIG. 1. In order to make such counting possible, therefore, the counter 48 is constructed of a 12-bit counter. To the end of preventing the counter 48 from overflowing, a NAND gate NG3 is disposed on the output side of the counter 48. The NAND gate NG3 has input connections as indicated by circles, and provides "0" when the upper-digit 8 bits of its count outputs become "1". Upon provision of this output "0", the entrance of the clock pulses from the AND gate AG1 to the counter 48 is inhibited. Among the 12-bit count outputs Q1–Q12 of the counter 48, the lower-digit 2 bits Q1 and Q2 are disregarded, and the upper-digit 10 bits Q3–Q12 are supplied to input terminals D1–D10 of the latch circuit 50. Therefore, the total deviation data for 12 periods (4 samples) made up of the count outputs of the counter 48 are supplied to the latch circuit 40 in the form in which the deviation data are divided by 4 being the total number of samples. After all, the latch circuit 50 latches the averaged deviation data for 1 sample in response to the latch signal S47 as shown in FIG. 8(M). As the outputs Q1–Q10 of the latch circuit 50, accordingly, the mean deviation data of 10 bits are obtained.

The latch outputs Q1–Q10 from the latch circuit 50 are supplied to a display unit as shown in FIG. 1 that has a decoder as illustrated in FIG. 2, and they are decoded and displayed. The input/output relations of the decoder and the display values on the panel face in this case are similar to those given in Table 3 before.

As described above, according to the embodiment of FIG. 7, the total deviation data corresponding to 4 samples are formed, and they are multiplied by ¼ and averaged and indicated in such a form. Accordingly, there is the effect that the display value is prevented from fluctuating frequently and that the reading of the display value becomes easy and reliable.

The embodiment of FIG. 7 adopts the display method based on the simple averaging. Therefore, in case where a string is flipped to produce a sound attended with frequency fluctuations, a deviation corresponding to the center of the frequency fluctuations (center frequency) is directly indicated. This brings forth the effect that where the center of the frequency fluctuations lies can be judged immediately and easily.

The effect is convenience, not only for the tuning, but also for a check after the tuning.

In performing this invention, various display units other than the foregoing one can be employed. Especially, it is favorable from a practical viewpoint to employ a multidigit display unit of the 7 segment type and to indicate the deviation value as the shift from the central position (0 cent position) as in the previous examples. In this case, the display control is made so that, as the deviation value increases in the positive or negative sign, one of display elements in the form of a vertical line as is more distant from the central position may be lit up. Thus, the display value and its fluctuations can be read intuitively.

As apparent from the detailed description given above, in the tuning apparatus according to this invention, an instantaneous deviation is not displayed as it is, but an average is taken of some instantaneous deviations and then displayed. Therefore, the display is sharply relieved from fluctuations and becomes easy to visually observe, and a reliable reading becomes possible. Especially, when as the display unit there is employed the type which indicates the deviation value by the use of dot-shaped or rectilinear display elements arranged in a manner to successively shift from the central position, the ease of visual observation and the exactitude of reading are more enhanced as an additional advantage. It makes an accurate and prompt tuning possible that, as stated above, the display is stabilized, while the reading of the display becomes easy and reliable.

The tuning apparatus according to this invention demonstrates especially excellent effects when used in case where a sound source to-be-measured itself is liable to frequency fluctuations as for example a guitar or a piano. Also in other musical instruments, musical sounds somewhat subjected to frequency fluctuations are produced, and hence, the effect of preventing fluctuations of display values can be expected.

The tuning apparatus according to this invention can also be utilized for automatic tuning apparatus for pianos. More specifically, the deviation data output of this apparatus is converted into an analog quantity by a D/A converter. The angle of rotation of a tuning hammer for turning a tuning pin of a piano is controlled on the basis of the data. The hammer is rotated until the deviation data output becomes zero. Then, the automatic tuning of a chord of the piano becomes possible. In this case, the purpose of the automatic tuning of the piano can be achieved more quickly and more precisely by performing a preliminary tuning with the first embodiment which averages while attaching importance to the newest data and by subsequently performing a final tuning with the second embodiment which averages simply.

FIG. 9 shows timepiece-containing tuning apparatus according to still another embodiment of this invention. This apparatus comprises an oscillator circuit 100 which generates clock pulses RF, a time keeping system 120 which forms time data for a timepiece on the basis of the clock pulses RF, a tuning system 130 which forms deviation data indicative of the deviation of a measured sound frequency from a reference frequency on the basis of the clock pulses RF, a multidigit segment-type display unit 150 which indicates the time data and the deviation data, and a control system for controlling data display on the display unit 150. The oscillator circuit 100 has a quartz oscillator 112 which oscillates at 32,768 Hz which is presently in practical use as a small-sized crystal for a timepiece. It generates the fixed-frequency clock pulses RF of 32,768 Hz. The clock pulses RF are supplied to the time keeping system 120 and the tuning system 130 as respective reference frequency signals, while they are supplied to a scanning circuit 140 as a reference clock signal. The scanning circuit 140 generates scanning signals SCN composed of sequentially occurring parallel pulses, on the basis of the clock pulses RF.

The time keeping system 120 includes as its principal constituent a circuit which generates a time data signal TA for the timepiece on the basis of the clock pulses RF. Besides this circuit, it includes a circuit which generates a mode switching signal MX on the basis of a sound production end timing signal SE from the tuning system 130, and a circuit which generates a display command signal DS on the basis of the actuation of a display command switch. The time data signal TA is a BCD code signal of decimal four digits (2 digits for hours and and 2 digits for minutes), and is transmitted to gate circuit 122. When a mode assignment signal MS assumes level "1", the gate circuit 122 generates a data output TB and supplies it to a multiplexor (MPX) 124. The multiplexor 124 provides an output in the form in which the time data input is time-divided at respective digits, in response to the scanning signal SCN supplied from the scanning circuit 140. Its data output TC is decoded by a decoder circuit 126. A decode output TD delivered from the decoder circuit 126 is supplied to a read only memory (ROM) 128, and is transformed here into a signal format necessary for indicating the time data with Arabic numerals. Assuming by way of example that the decoder output TD (ROM input) is indicating "1" which corresponds to the most significant digit (ten-hour digit) in the time data for "12:50", the ROM 128 converts this decode output TD indicative of "1" into a display control output in which only output lines b and c assume level "1". The ROM 128 having such a converting function can be readily constructed in conformity with desired display contents (Arabic numerals in this embodiment) once the number of outputs of the decode circuit 126 (sixteen in this embodiment) and the number of segments of the display unit to be used (seven in this embodiment) have been determined. Output lines of the ROM 128 are seven lines a–g and one line p totaling eight lines, and all the output lines are connected to the display unit 150. A segment driver circuit may be disposed between the ROM 128 and the display unit 150.

The display unit 150 is a 4-digit 7-segment type display unit which is known in itself. It has seven segments a–g at each of the first digit I-the fourth digit IV, and it has also two middle-point segments p1 and p2. The same ones of the segments a–g at the respective digits are driven in common in response to signals from the corresponding output lines a–g of the ROM 128. The middle-point segments p1 and p2 are driven in response to a signal from the output line p of the ROM 128. The signal of the output line p of the ROM 128 can be generated so as to assume the level "1" in synchronism with the digit drive of, for example, the second digit II. Thus, the hour and the minute can be partitioned in the display by the middle points p1 and p2. A digit driver circuit 152 which performs the digit drive in response to the scanning signal SCN is connected to the display unit 150. The digit driver circuit 152 drives the respective digits in response to the scanning signals SCN provided from the scanning circuit 140 and in synchronism with the operation of distributing and supplying signals to the segment groups of the respective digits by the multiplexor 124. Accordingly, the time display is carried out in time division by the so-called dynamic drive system.

An example of the time display in the display unit 150 is shown in FIG. 13(A), and it is "12:50". As the display unit 150, a multidigit display unit of an 8- or 9-segment type may well be used. In this case, the contents of the ROM 128 may be somewhat changed.

On the other hand, the tuning system 130 includes as its principal constituent a circuit which generates a deviation data signal UA indicative of the deviation of the measured sound frequency from the reference frequency on the basis of the clock pulses RF. Besides this circuit, it includes a circuit which generates the signal SE indicating the sound production end timing of the measured sound. The deviation data signal UA is a decoded binary signal, and is supplied to a multiplexor 134 through a gate circuit 132. A data output UB of the gate circuit 132 is generated when the mode assignment signal MS assumes level "0", that is, when the gate circuit 122 on the timepiece side as previously stated provides no output. The multiplexor 134 provides the data output UB from the gate circuit 132 in response to the scanning signal SCN and in synchronism with the digit drive of the display unit 150, and its data output UC is supplied to a ROM 136. The ROM 136 converts the data output UC from the multiplexor 134 into a data signal for display UD, and supplies it to the display unit 150. As in the foregoing case of indicating the time data for the timepiece, the display unit 150 which receives the data signal for display UD has the first digit I-the fourth digit IV successively driven by the digit driver circuit 152. The respective digit drive operations are carried out in synchronism with the operations of supplying signals to the segment groups of the respective digits as are performed by the multiplexor 134. The segments a–g of the digits I–IV of the display unit 150 are respectively driven by the corresponding outputs a–g of the ROM 136, and the middle points p1 and p2 are driven by the output p of the ROM 136 in synchronism with the digit drive of, e.g., the second digit II. A segment driver circuit may be disposed between the ROM 136 and the display unit 150.

As stated above, also in the case of the deviation data display, the display unit 150 is driven in time division by the dynamic drive system. Concrete display aspects of the respective digits are determined by the stored contents of the ROM 136. In this embodiment, deviations to be displayed are classified into eleven states. Among them, nine deviation levels which lie within a deviation range of ±10 cents relative to the reference (0 cent) are indicated by eight vertical segment pairs (segment pairs b–c and f–e of the respective digits) and one middle-point pair (p1–p2), totaling nine display elements, in the display unit 150. The remaining two deviation levels on the low-pitched sound side and the high-pitched sound side that fall outside the deviation range are indicated by displaying letters "L" and "H" with the first digit I and the fourth digit IV of the display unit 150 respectively. In order to make the indications possible, the stored contents of the ROM 136 are specified so that the input/output relations may become as given in Table 6.

TABLE 6

| Input (Display deviation) | | Output |
|---|---|---|
| Da | (H) | b, c, e, f, g of the 4th digit IV |
| Db | (+10) | b, c, of the 4th digit IV |
| Dc | (+8) | e, f of the 4th digit IV |
| Dd | (+6) | b, c of the 3rd digit III |
| De | (+4) | e, f of the 3rd digit III |
| Df | (+2) | middle points p (pl, ps) |
| Dg | (−4) | b, c of the 2nd digit II |
| Dh | (−6) | e, f of the 2nd digit II |
| Di | (−8) | b, c of the 1st digit I |
| Dj | (−10) | e, f of the 1st digit I |
| Dk | (L) | d, e, f of the 1st digit I |

The ROM 136 which effects the converting functions as listed in Table 6 can be readily constructed by one skilled in the art, and therefore the details will not be explained.

As described above, in this embodiment, the clock pulse oscillator circuit 100 common to the time keeping system 120 and the tuning system 130 is disposed, and the 4-digit 7-segment type display unit 150 is used both for the display of the time data from the time keeping system 120 and for the display of the deviation data from the tuning system 130. In the data display, the time data represent hour and minute with four digits of Arabic numerals as shown by way of example in FIG. 13(A), while the deviation data represent the eleven stages of deviation levels with the positions of the vertical segments and the letters "L" and "H" as shown by way of example in FIG. 13(B)–(D). The display system of the deviation data will be stated later.

A power source circuit 160 has batteries 162, and supplies required operating power to the various circuit portions. The tuning system 130 is fed with the required operating power through a power switch circuit (PS) 164. As will be explained in detail later, the tuning system 130 includes an operational amplifier and other circuit elements of high power dissipation. In order to suppress consumption of the batteries 162, therefore, the operating power is supplied to the tuning system 130 through the power switch circuit 164 only during the tuning. More specifically, the power switch circuit 164 is controlled by the inverted signal MS of the mode assignment signal MS. Only when the inverted signal MS is "1" (the signal MS is "0"), the power switch circuit supplies the operating power to the tuning system 130. When the mode assignment signal MS is "1" (MS is "0"), and the apparatus is in the time data display mode, the power switch circuit is in the "off" state and cuts off the operating power to the tuning system 130.

A mode assignment switch 170 is connected in series with a resistor R1 between a voltage source +V (the voltage of the batteries 162 may be used in common) and an earth point, and it is formed of a normally-open push-button switch. In the initial state in which the switch 170 is "off", the operation of the timepiece mode or the time data indicating mode is conducted. When the switch 170 is pushed and released once (turned "on" and "off"), the operation of the tuning mode or the deviation data indicating mode is carried out. A set preferential flip-flop 172 is adapted to operate as a T (trigger) flip-flop which receives as its trigger input an on-off signal corresponding to the switching state of the switch 170. Its output Q is "1" and its output Q is "0" in the initial state in which the switch 170 is "off". When the switch 170 is pushed and released, the flip-flop 172 is triggered by the on-off signal from the switch 170, and its output state is inverted, Q becoming "0" and Q becoming "1". When the switch 170 is pushed and released once more, the output Q becomes "1", and the original state is restored. A mode changeover signal MX is applied from the time keeping system 120 to a set input terminal S of the flip-flop 172. When the signal MX assumes the level "1", the state of the output Q="1" and the output Q="0" is preferred even if the flip-flop 172 is in the state of the output Q="0" and the output Q="1" in accordance with the actuated state of the switch 170. The mode assignment signal MS is formed of the output Q of the flip-flop 172, and the inverted signal MS the output Q. Accordingly, the operation of the timepiece mode wherein the mode assignment signal MS becomes "1" and wherein the gate circuit 22 transmits the time data is carried out when the apparatus is in the initial state in which the switch 170 is not pushed, when the initial state is reset by pushing the switch 170 twice, and when the mode switching signal MX becomes "1" when a fixed time lapses after the production of the measured sound has ended as will be stated later. Thus, even if one forgets to push the switch 170, the change-over from the tuning mode to the timepiece mode can be automatically effected. The mode assignment signal MS becomes "0" contrary to the above when the switch 170 is pushed and released once. At this time, an output of an inverter 174 is "1" to cause the gate circuit 132 to transmit the deviation data. On the other hand, the inverted signal MS is "1", so that the power switch circuit 164 falls into the "on" state and that an output of an OR gate 176 becomes "1" to cause the gate circuit 142 to transmit the scanning signal SCN. In this case, accordingly, the tuning system 130 falls into the operative state, the deviation data can be indicated on the display unit 150, and the operation of the tuning mode or deviation data display mode is executed.

In the circuit of FIG. 9, the display command signal DS is generated from the time keeping system 120 so as to assume the level "1" during a fixed time after pushing a display command switch 220 to be stated later. It is applied to the gate circuit 142 through the OR gate 176. Accordingly, even when the foregoing mode assignment signal is at the "1" level and the apparatus is in the timepiece mode, the scanning signal SCN is not produced and the display of the time data is not executed unless the display command switch is pushed to bring the display command signal DS into the "1" level. Therefore, only when it is necessary to see the time, the time data can be indicated for the fixed time by pushing the display command switch. Also in this respect, the power of the batteries 162 is not consumed uselessly. A circuit for generating the display command signal DS will be described later.

Figure 10:
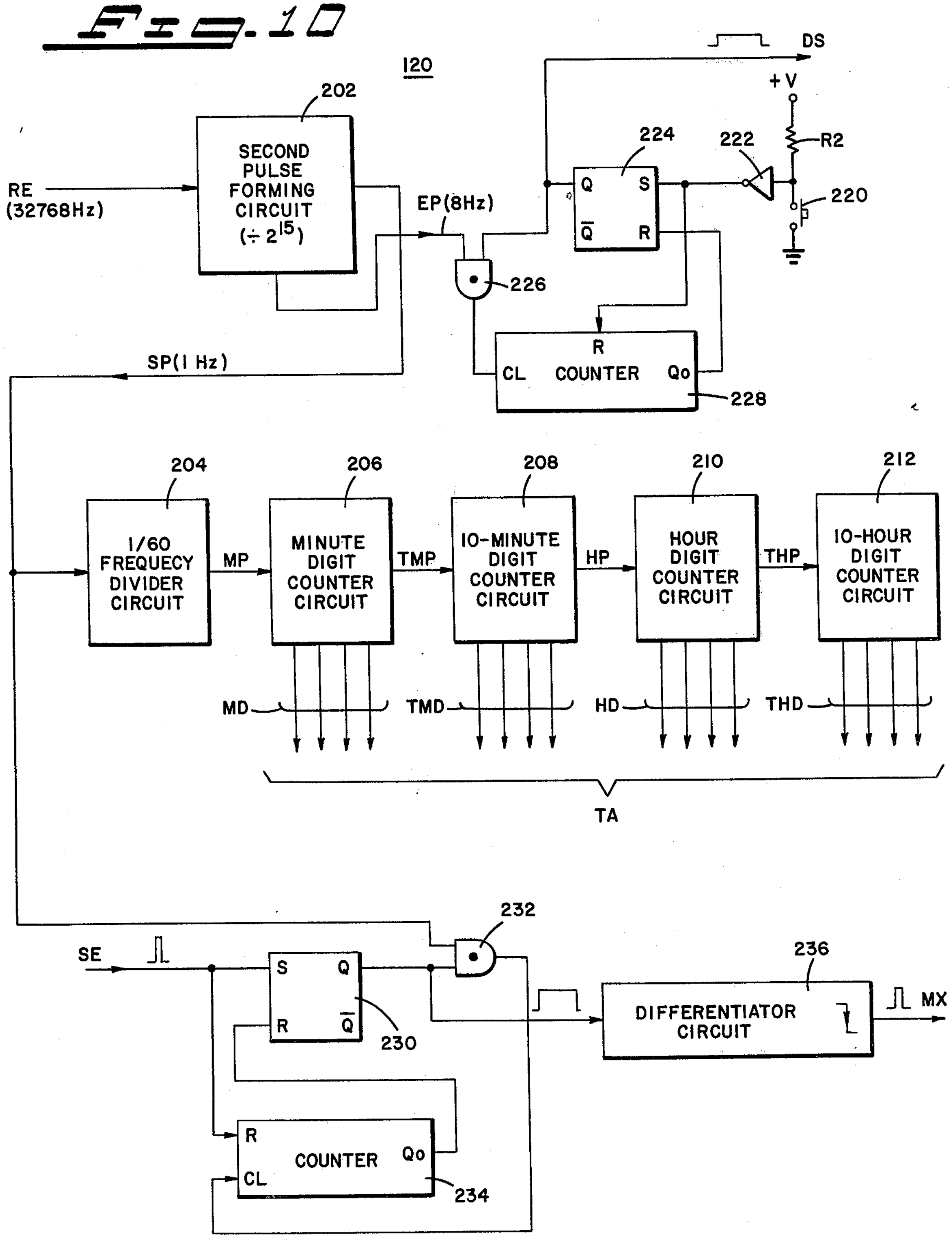
FIG. 10 is a circuit diagram which shows an internal construction of a time keeping system in the apparatus of FIG. 9.

Referring now to FIG. 10, the construction and operation of the time keeping system 120 in the apparatus of FIG. 9 will be described. A second pulse forming circuit 202 subjects the clock pulses RF of 32,768 Hz to 1/215 frequency division, thereby to generate second pulses SP of 1 Hz. The second pulses SP are changed into minute pulses MP by a 1/60 frequency divider circuit 204. A minute digit counter circuit 206 counts the minute pulses MP, to generate a minute data MD formed of a 4-bit binary signal and to generate one 10-minute pulse TMP each time ten minute pulses MP are counted. A 10-minute digit counter circuit 208 counts the 10-minute pulses TMP, to generate 10-minute data TMD formed of a 4-bit binary signal and to generate one hour pulse HP each time six 10-minute pulses are counted. An hour digit counter circuit 210 counts the hour pulses HP, to generate hour data HD formed of a 4-bit binary signal and to generate one 10-hour pulse THP each time ten hour pulses are counted. A 10-hour digit counter circuit 212 counts the 10-hour pulses THP to generate 10-hour data THD. Accordingly, the time data signal TA is transmitted to the foregoing gate circuit 122 as a BCD code signal which includes the minute data MD, the 10-minute data TMD, the hour data HD and the 10-hour data THD.

Besides the time data forming circuit described above, the circuit for generating the display command signal DS and the circuit for generating the mode switching signal MX are shown in FIG. 10.

In the circuit for generating the display command signal DS, the display command switch 220 previously referred to is disposed. This switch 220 is constructed of a normally-open push-button switch which is connected in series with a resistor R2 between the voltage source +V (the voltage of the batteries 162 may be used in common) and the earth point. An on-off signal responsive to the switching state of the switch 220 is supplied through an inverter 222 to set input terminal S of a flip-flop 224 and also to a reset input terminal R of a counter 228. An output Q of the flip-flop 224 is supplied to one input terminal of an AND gate 226. To the other input terminal of the AND gate 226, a pulse signal of 8 Hz derived from the second pulse forming circuit 202 previously stated is applied. An output of the AND gate 226 is entered into a clock input terminal CL of the counter 228, and an output Qo of the counter 228 is supplied to a reset input terminal R of the flip-flop 224. In the initial state in which the switch 220 is not pushed yet, the flip-flop 224 is in the reset state, and the display command signal DS formed of the output Q is at the "0" level. Subsequently, when the switch 220 is pushed, the flip-flop 224 is triggered through the inverter 222 and shifts into the set state. Simultaneously therewith, the counter 228 is reset. When the flip-flop 224 is set, the output Q becomes "1", so that the display command signal DS becomes "1" and that the pulse signal EP of 8 Hz is entered into the counter 228 through the AND gate 226. However, while the switch 220 is kept pushed the counter 228 is supplied with the reset signal, so that the counter 228 does not start counting. When the switch 220 is released, the reset signal is prevented from entering the counter 228, so that the counter starts counting. Assuming here that the counter 228 is constructed of a 1/16 frequency division counter, it generates the output Qo="1" and resets the flip-flop 224 two seconds after the flip-flop 224 has been set (after the switch 220 has been released). Accordingly, the display command signal DS is produced in such a form that its period of the level "1" continues for the time during which the switch 220 is kept pushed and for the subsequent two seconds. As previously stated, while the display command signal DS assumes the "1" level, the scanning signal SCN is provided through the gate circuit 142 in FIG. 9. Therefore, the time data display as exemplified in FIG. 13(A) becomes possible.

Accordingly, when the switch 220 is pushed, the time can be seen on the display unit 150 during at least 2 seconds. If it is desired to see the time still longer, the switch 220 may be kept pushed.

On the other hand, in the circuit for generating the mode change-over signal MX, a flip-flop 230 is disposed which receives the sound production end timing signal SE at its set input terminal S (the manner of generation of the signal SE will be described in detail later with reference to FIG. 11). An output Q of the flip-flop 230 is supplied to one input terminal of an AND gate 232, the other input terminal of which is supplied with the second pulse SP of 1 Hz. An output of the AND gate 232 is supplied to a clock input terminal CL of a counter 234, a reset input terminal R of which is supplied with the sound production end timing signal SE. An output Qo of the counter 234 is applied to a reset input terminal R of the flip-flop 230. The output Q of the flip-flop 230 is supplied to a fall differentiator circuit 236, and the mode change-over signal MX is formed of an output of the fall differentiator circuit 236. Now, consider the initial state in which the sound production end timing signal SE assumes the "0" level. Then, the flip-flop 230 is in the reset state, and the output Q is at the "0" level. Accordingly, both the output of the AND gate 232 and the output of the fall differentiator circuit 236 are the "0" level. Subsequently, when the sound production end timing signal SE becomes the "1" level, the flip-flop 230 is set into the output Q="1", and simultaneously therewith, the counter 234 is reset. When the output Q of the flip-flop 230 becomes "1", the AND gate 232 allows the second pulses SP to pass. When the sound production end timing signal SE becomes the "0" level meantime, the counter 234 begins to count the second pulses SP. Assuming here that the counter 234 is constructed of a 1/120 frequency division counter, it becomes the output Qo="1" upon lapse of two minutes after the production of the measured sound has ended, i.e., after the sound production end timing signal SE being the differentiated pulse signal has changed from "1" to "0". The flip-flop 230 is reset by the output Qo="1". Therefore, the output Q of the flip-flop 230 is generated in such a form as to assume the "1" level during two minutes, and it changes from "1" to "0" upon the lapse of the two minutes. The fall differentiator circuit 236 subjects the output Q of the flip-flop 230 to fall differentiation, and generates a positive-going differentiated pulse synchronous with the change of the output Q from "1" to "0". Accordingly, the mode change-over signal MX becomes the positive-going pulse which turns from "0" to "1" upon lapse of two minutes after the end of the production of the measured sound. Since the mode switching signal MX brings the flip-flop 172 in FIG. 9 preferentially into the set state, the mode assignment signal MS becomes the "1" level in response thereto, and the operation of the timepiece mode is executed.

Figure 11:
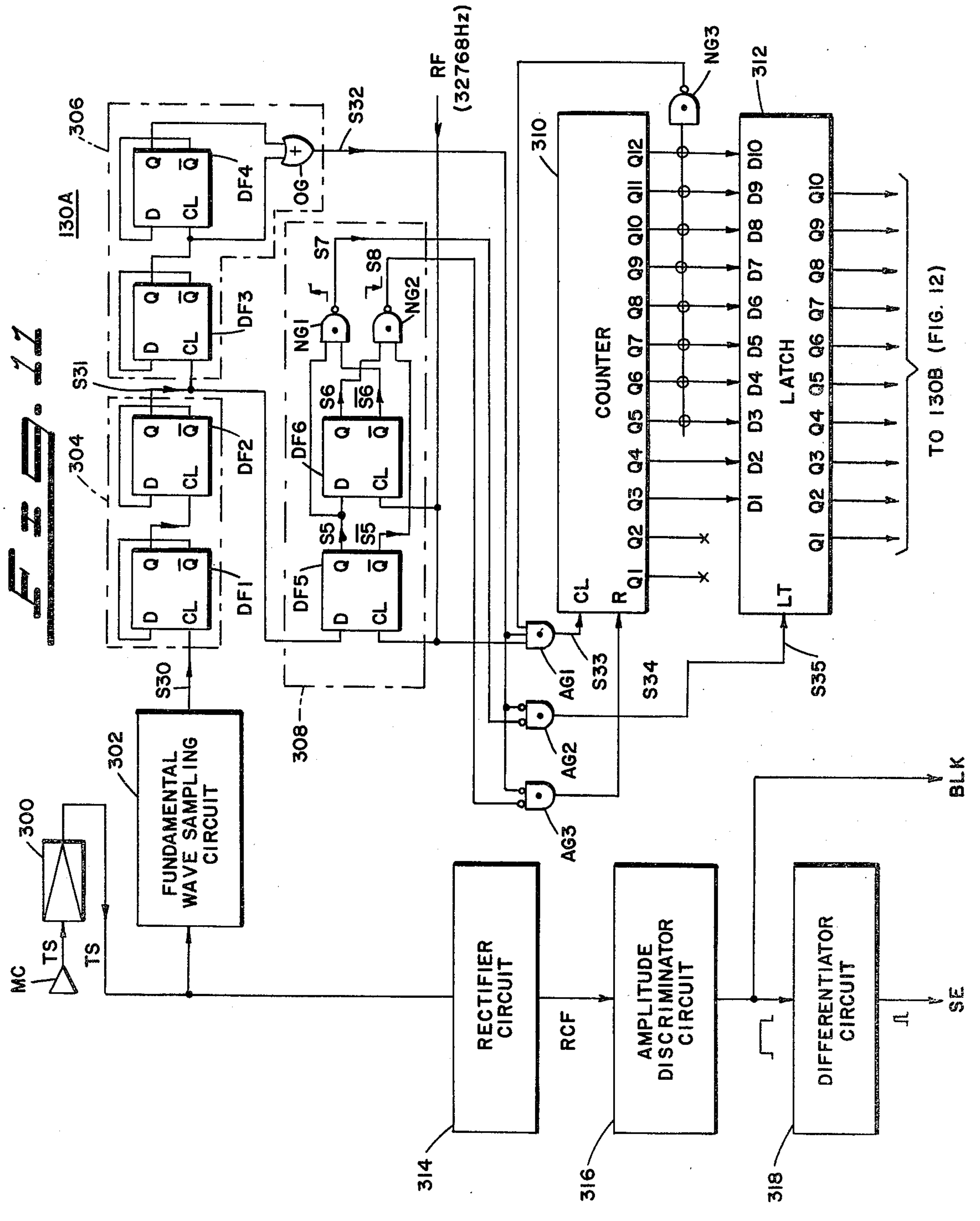
FIG. 11 is a circuit diagram which shows a deviation data-forming circuit of a tuning system in the apparatus of FIG. 9.
Figure 12:
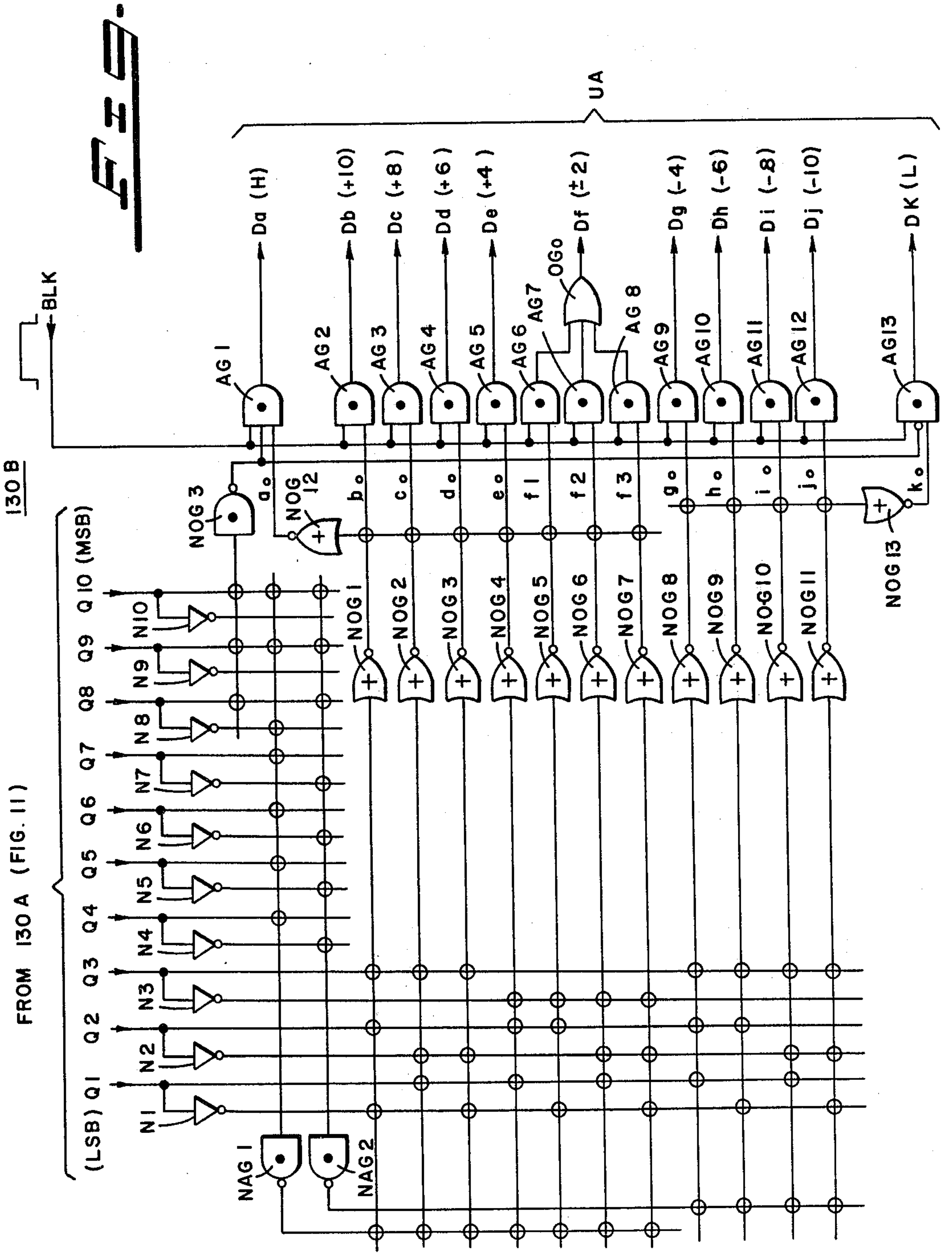
FIG. 12 is a circuit diagram which shows a decoder circuit of the tuning system in the apparatus of FIG. 9.

Referring now to FIGS. 11 and 12, the construction and operation of the tuning system 130 in the apparatus of FIG. 9 will be explained. Likewise to the apparatus in FIG. 7 described before, the tuning apparatus of this embodiment has been designed so as to be used mainly for the tuning of the guitar. It can decide how large the frequency deviation of the open sound of the fifth string is relative to the reference sound frequency 110 Hz often employed in the tuning of the guitar.

In FIG. 11, a deviation data forming circuit 130A of the tuning system 130 consists fundamentally in that a counter 310 is disposed which counts the clock pulses RF of 32768 Hz so as to obtain count values quadruple of those given in Table 1 mentioned before, and that the count outputs of the counter 310 (total deviation data) are divided by 4 so as to form mean deviation data. That is, the clock pulses corresponding to 4 samples (12 periods) of the input fundamental wave are counted and then multiplied by $\frac{1}{4}$. Therefore, letting A, B, C and D denote the count values of the respective samples, an operation represented by the equation of $(A+B+C+D)/4$ is executed, and the deviation data corresponding to 1 sample in the form in which the instantaneous deviation data are averaged as to the 4 samples is obtained. This measure wherein mere instantaneous deviation data corresponding to 1 sample is not found but the mean deviation data with some instantaneous deviation data (in this case, 4 instantaneous deviation data) averaged is found, intends to avoid frequent changes of a display value and to stabilize the display, thereby making it possible to easily and reliably read the display value.

In the deviation data forming circuit 130A, MC designates an acousto-electric transducer such as a microphone which picks up a sound to-be-measured and converts it into an electrical tone signal TS. The tone signal TS from the acousto-electric transducer MC is entered into a fundamental wave sampling circuit 302 through an amplifier 300. The fundamental wave sampling circuit 302 samples a fundamental wave from the tone signal TS, and generates a fundamental wave pulse signal S30 of a period corresponding to that of the fundamental wave. Since a circuit system from a $\frac{1}{4}$ frequency division circuit 304 receiving the fundamental wave pulse signal S30 to a latch circuit 312 have quite the same arrangements and operations as in the foregoing embodiment shown in FIG. 7, the corresponding relations of the constituent elements and signals will be described but the detailed explanation will be omitted. The $\frac{1}{4}$ frequency division circuits 304 and 42, the signals S31 and S42, the gate signal forming circuits 306 and 44, the signals S32 and S44, the synchronizing differentiator circuits 308 and 46, the counters 310 and 48, the latch circuits 312 and 50, the signals S33 and S45, the signals S34 and S46, and the signals S35 and S47 correspond to each other and have the same functions, respectively. As a result, mean deviation data of 10 bits are obtained as the outputs Q1–Q10 of the latch circuit 312. The mean deviation data is transmitted to a decoder circuit 130B shown in FIG. 12.

The circuit 130A in FIG. 11 is provided with a rectifier circuit 314 which rectifies the tone signal TS to generate a rectified output RCF, an amplitude discriminator circuit 316 which discriminates the amplitude of the rectified output RCF to generate a blanking signal BLK and which is consists of, for example a Schmitt trigger circuit, and a differentiator circuit 318 which subjects the blanking signal BLK to fall differentiation to generate the sound production end timing signal SE. Here, the blanking signal BLK is generated so as to assume the "1" level during the interval during which the measured sound is produced and to assume the "0" level during the interval during which it is not produced. It is supplied to the decoder circuit 130B in FIG. 12 in order to control the transmission of decode outputs. In the circuit of FIG. 12, the control is made in which, in response to the blanking signal BLK, the decode outputs are transmitted onto the display unit side only during the production interval of the measured sound. In consequence, no indication appears on the display unit during the non-production interval of the measured sound, and the consumption of the battery power is suppressed. The sound production end timing signal SE indicates that the production interval of the measured sound has ended. It is supplied to the foregoing circuit of FIG. 10 and is used for forming the mode change-over signal MX.

FIG. 12 shows the decoder circuit 130B which receives the latch outputs Q1–Q10 from the deviation data forming circuit 130A, i.e. the mean deviation data. The decoder circuit 130B is constructed so as to have input/output relations as given in Table 7.

TABLE 7

| Input (Mean Deviation) Decimal Number | (MSB) Binary (LSB) | Output (Display Content) | |
|---|---|---|---|
| <889 | <1101111001 | Da | (H) |
| 889 | 1101111001 | Db | (+10) |
| 890 | 1101111010 | Dc | (+8) |
| 891 | 1101111011 | Dd | (+6) |
| 892 | 1101111100 | De | (+4) |
| 893 | 1101111101 | | |
| 894 | 1101111110 | Df | (±2) |
| 895 | 1101111111 | | |
| 896 | 1110000000 | Dg | (−4) |
| 897 | 1110000001 | Dh | (−6) |
| 898 | 1110000010 | Di | (−8) |
| 899 | 1110000011 | Dj | (−10) |
| >899 | >1110000011 | Dk | (L) |

According to this Table 7, 893–895 are indicated as ±2 cents, and 896, 897, 898, and 899 are indicated as −4, −6, −8 and −10, respectively. Although the corresponding relations are not exactly the same as those given in Table 1, discrepancies in the display to such an extent are quite negligible in practice.

In the decoder circuit 130B shown in FIG. 12, N1–N10 designate inverters which invert the latch outputs (mean deviation data) Q1 (LSB)–Q10 (MSB) respectively. NAG1–NAG3 designate NAND gates each of which provides an output "1" even if one of the input is "0" and provides an output "0" if all the inputs are "1". NOG 1–NOG12 designate NOR gates each of which provides an output "1" if all inputs are "0" and provides an output"0" if even one of the inputs is "1". Circular marks in FIG. 12 indicate input connections of the respective gates.

The NAND gate NAG1 serves to generate the output "0" upon detecting that the upper-digit 7 bits (Q10–Q4) of the latch outputs from the latch circuit 312 are "1101111". The NOR gate NOG1 generates its output bo="1" when the lower-digit 3 bits (Q3–Q1) of the latch outputs are "001" and the output of the NAND gate NAG1 is "0" (that is, when the mean deviation data is 889 in the decimal notation). The output bo="1" has its AND taken with the blanking signal BLK by an AND gate AG2. Therefore, only when the blanking signal BLK is "1", the output Db of the AND gate AG2 becomes "1", and the display of the deviation data of +10 cents is made possible. Likewise, in case where the output of the NAND gate NAG1 is "0", when the lower-digit 3 bits of the latch outputs are "010", "011", "100", "101", "110" and "111" respectively (that is, when the mean deviation data are 890, 891, 892, 893, 894, and 895 in the decimal notation respectively) respective outputs co, do, eo, f1, f2 and f3 of the NOR gates NOG2, NOG3, NOG4, NOG5, NOG6 and NOG7 become "1". Therefore AND gates AG3, AG4 and AG5 which receive the outputs co, do and eo at their one-side input terminals respectively provide AND outputs Dc, Dd and De of "1" when the blanking signal BLK applied to the other-side input terminals is "1". Thus, they permit the displays of the deviation data of +8 cents, +6 cents and +4 cents respectively. When the output of any of AND gates AG6–AG8 becomes "1", the output Df of an OR gate OGO becomes "1", so that the display of the deviation data of ±2 cents becomes possible.

On the other hand, the NAND gate NAG2 serves to generate the output "0" upon detecting that the upper-digit 7 bits (Q10–Q4) of the latch outputs are "1110000". In case where the NAND gate NAG2 provides the output "0", when the lower-digit 3 bits (Q3–Q1) of the latch outputs are "000", "001", "010" and "011" respectively (that is, when the mean deviation data are 896, 897, 898 and 899 in the decimal notation respectively), respective outputs go, ho, io and jo of the NOR gates NOG8, NOG9, NOG10 and NOG11 become "1". Accordingly, AND gates AG9, AG10, AG11 and AG12 which receive the outputs go, ho, io and jo at their one-side input terminals respectively provide AND outputs Dg, Dh, Di and Dj of "1" when the blanking signal BLK impressed on the other-side input terminals is "1". Thus, they permit the displays of the deviation data of −4 cents, −6 cents, −8 cents and −10 cents respectively.

The NAND gate NAG3 receives signals of the upper-digit 3 bits of the latch outputs, and generates the output "1" if even one of the received signals is "0". Here, the fact that at least one of the received signals is "0" signifies that the latch outputs are equal to or smaller than 895 in the decimal notation. Therefore, if the output of the NAND gate NAG3 is "1", it is decided that the measured sound shifts substantially on the high-pitched sound side, and if the output is "0", it is decided that the measured sound shifts on the low-pitched sound side. On the other hand, the NOR gate NOG12 receives the aforecited NOR outputs bo, co, do, eo and f1–f3 as its inputs. It generates an output "1" when all the inputs are "0", and it generates an output "0" in any other case. The AND gate AG1 receives the blanking signal BLK, the output of the NAND gate NAG3 and the output ao of the NOR gate NOG12 as its inputs, and provides its output Da="1" when all these input signals are "1". That is, the output DA="1" is generated when "0" is provided in any of the upper 3 digits (Q8, Q9, Q10) (this signifies that the latch outputs are not greater than 895 in the decimal notation) and besides the lower 3 digits are not any of "010", "011", "100", "101", "110" and "111" (the latch outputs are not any of 891, 892, 893, 894, and 895 in the decimal notation) (they are "0" outputs). Accordingly, the output Da="1" indicates that the measured sound shifts more than 10 cents on the highpitched sound side, so that the display of the deviation of "H" becomes possible with the output Da.

The NOR gate NOG13 receives the foregoing NOR outputs go, ho, io and jo as its inputs. It generates its output ko="1" when all these inputs are "0", and generates its output ko="0" in any other case. An AND gate AG13 receives the output from the NAND gate NAG3 at an inverting input terminal thereof, and receives the output ko of the NOR gate NOG13 and the blanking signal BLK at respective non-inverting input terminals thereof. When the input signal to the inverting input terminal is "0" (when the measured sound is not a higher-pitched sound, that is, it deviates on the low-pitched sound side), the AND gate AG13 generates its output Dk="1" provided that the input signals to the non-inverting input terminals are "1" (that is, all the foregoing NOR outputs go-jo are "0", in other words, the latch outputs are not any of 896, 897, 898 and 899 in the decimal notation) and that the blanking signal BLK is "1". Accordingly, the output Dk="1" indicates that the measured sound deviates more than 10 cents on the low-pitched sound side, so that the display of the deviation data of "L" becomes possible with the output Dk.

Figure 13:
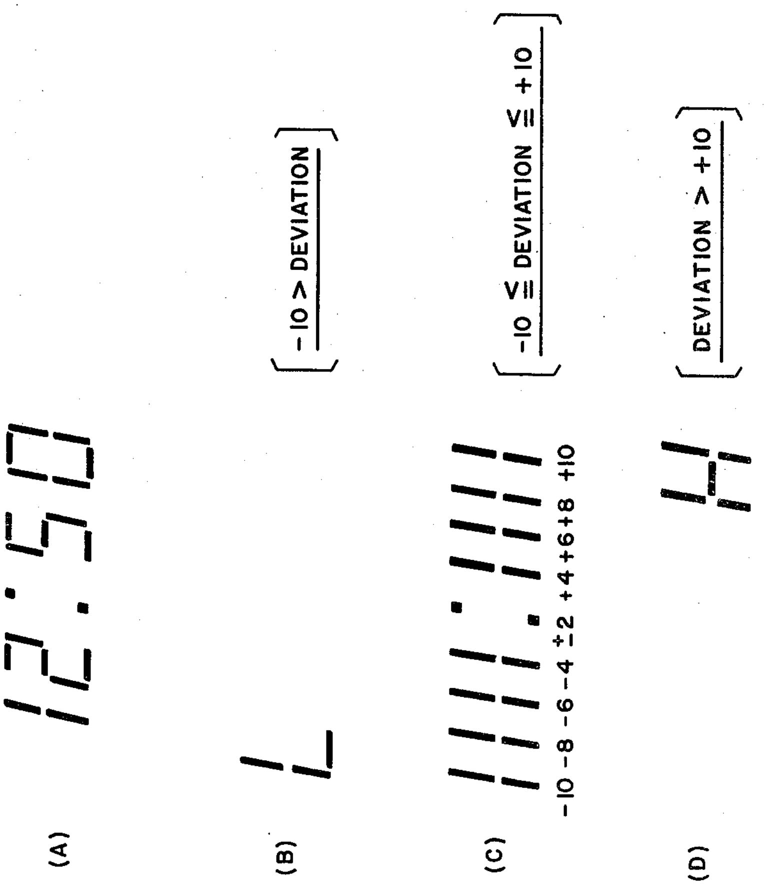
FIGS. 13(A)–13(D) are diagrams which show examples of data displays of a display unit in the apparatus of FIG. 9.

A deviation data signal UA made up of the decode outputs Da–Dk obtained as above described is applied to the ROM 136 through the gate circuit 132 and the multiplexor 134 as previously explained with reference to FIG. 9. As a result, the deviation data display in the aspect as illustrated in Table 6 is made on the display unit 150. FIGS. 13(B)–13(D) illustrate the display aspect in this case with concrete sampled patterns. (B) shows the letter "L" which is indicated by the segments d, e and f of the first digit I of the display unit 50 when the deviation on the low-pitched sound side is greater than −10 cents. When the deviations lie between −10 cents and +10 cents, the deviation levels in nine stages are individually indicated by the vertical segment pairs b–c and e–f of the first digit I-the fourth digit IV and the middle point pair pl-p2 in the display unit 50 as shown in FIG. 13(C). Further, when the deviation on the high-sound side is greater than −10 cents, the letter "H" is indicated by the segments b, c, e, f and g of the fourth digit IV of the display unit 50 as shown in FIG. 13 (D).

According to the tuning apparatus described above, simultaneously, with the detection of the mean deviation of the measured sound from the reference frequency, the deviation information is visibly indicated as the positional difference among the vertical line-shaped display elements, so that the following excellent functional effects are achieved:

(1) Regarding how the measured sounds deviate from the reference, the individual deviations can be indicated precisely.

(2) Since the variation of the display value is expressed as the variation of the positions of the display elements, it can be easily followed by eyes, and the deviation from the reference can be intuitively known.

The above embodiment has been described as depicting the letter "L" or "H" in case where the deviation exceeding 10 cents exists on the low-pitched sound side or the high-pitched sound side respectively. The same content, however, can be indicated by depicting any other symbol instead of the letter.

Figure 14:
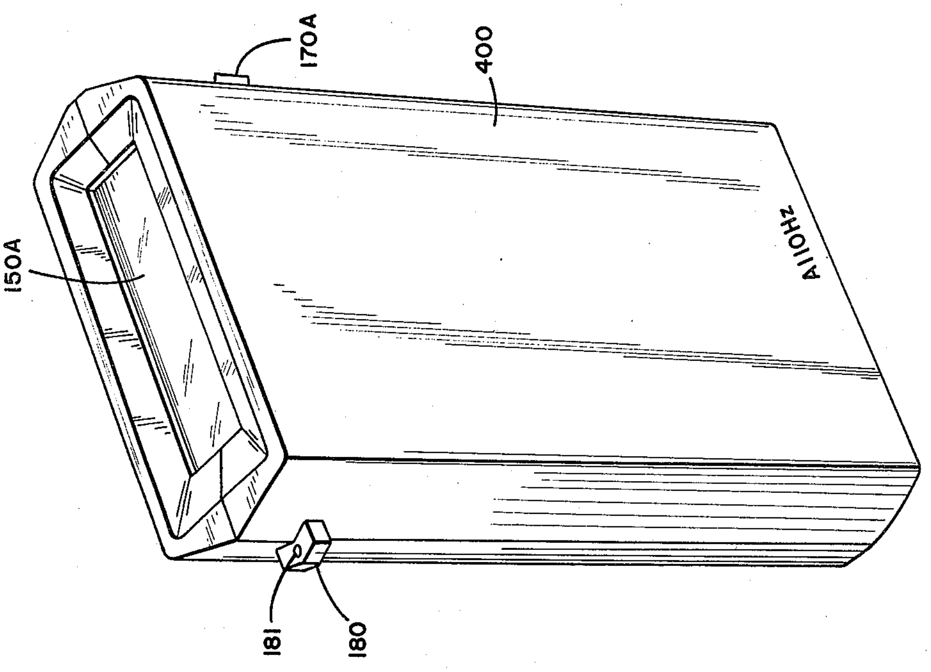
FIG. 14 is a perspective view which shows an example of an external structure of the apparatus of FIG. 9.

FIG. 14 shows an example of the external structure of the timepiece-containing tuning apparatus described above in detail. In this example, a pendant-type structure is adopted. All the electronic circuit systems above stated are housed within a case 400. 150A designates the display face of the display unit 150, while 170A designates the push-button of the mode assignment switch 170. The pendant type timepiece-containing tuning apparatus in FIG. 14 can be used with a proper chord or chain coupled into an opening 181 of a protuberance 180. It can be caused to function as the timepiece in some cases, and as the tuning device in other cases.

As other external structures which can be adopted, there are considered various structures such as wrist watch type structure, and pocket watch type structure.

As the display unit, a dot matrix type display unit, etc. can be used besides the foregoing ones.

As set forth above, according to this invention, the timepiece-containing tuning apparatus which is small in size and light in weight and is therefore convenient to carry is realized. With the tuning apparatus, an identical apparatus body can be used selectively as the timepiece or as the tuning device, so that the utilization efficiency of the body is high and that the degree of effectiveness with respect to the purchase cost is high. Since digital circuits form the main constituents, both the timepiece precision and the tuning precision are high, and the performances are high as a whole. A further advantage is that the circuits can be readily put into the form of an integrated circuit or circuits. Especially when the LSI technique is utilized, the external dimensions of the timepiece alone and the apparatus containing the timepiece can be made almost equal, which is suitable for making the size small and the weight light. An article with the apparatus of FIG. 9 put into an LSI was manufactured by way of trial by the inventor. It could be housed in a case which was as small as 30 mm in breadth, 58 mm in length and 14 mm in thickness.

It should be apparent to one skilled in the art that the above-described embodiments are merely a few of the many specific embodiments which represent the application of the principles of the present invention. Numerous and varied other embodiments can be readily devised by those skilled in the art without departing from the spirit and scope of the present invention.

What is claimed is:

1. A tuning apparatus comprising circuit means for forming means deviation data and for updating said mean deviation data from instantaneous deviations of a measured sound frequency from a reference frequency, said circuit means comprises:

a counter circuit which provides instantaneous deviation data every fixed time interval, a first memory circuit which temporarily stores the instantaneous deviation data from said counter circuit, an adder circuit which receives data read out from said first memory circuit on one input side thereof, means for halving an addition output from said adder circuit, and a second memory circuit which temporarily stores the halved addition output for the purpose of indicating the halved addition output of said display means, said adder circuit receiving on the other input side thereof data read out from said second memory circuit and indicated in a preceding display, whereby the mean deviation data which has been updated with the preceding display data and the instantaneous deviation data is derived from said second memory circuit; and display means for visibly indicating said mean deviation data.

2. A tuning apparatus comprising circuit means for forming mean deviation data and updating said mean deviation data from instantaneous deviations of a measured sound frequency from a reference frequency, and display means for visibly indicating said mean deviation data, said display means being so constructed that a mean deviation in a state in which a tuning is substantially established is indicated by a display element situated at a specified position on a display panel, and that a mean deviation responsive to a sound shift onto a high-pitched sound side or a low-pitched sound side in a state in which the tuning is not substantially established is indicated by a display element situated at a position shifting onto one side or onto the other side respectively from said specified position of said display panel.

* * * * *